(12) United States Patent
Katrak

(10) Patent No.: US 11,143,684 B2
(45) Date of Patent: Oct. 12, 2021

(54) DIAGNOSTIC SYSTEM FOR A VEHICLE ELECTRICAL SYSTEM

(71) Applicant: LG Chem, Ltd., Seoul (KR)

(72) Inventor: Kerfegar K. Katrak, Fenton, MI (US)

(73) Assignee: LG Energy Solution, Ltd., Seoul (KR)

( * ) Notice: Subject to any disclaimer, the term of this patent is extended or adjusted under 35 U.S.C. 154(b) by 396 days.

(21) Appl. No.: 16/363,146

(22) Filed: Mar. 25, 2019

(65) Prior Publication Data
US 2020/0309837 A1    Oct. 1, 2020

(51) Int. Cl.
G06F 11/30 (2006.01)
G01R 31/00 (2006.01)
G06F 16/901 (2019.01)
G06F 11/07 (2006.01)

(52) U.S. Cl.
CPC ........ *G01R 31/007* (2013.01); *G06F 11/0772* (2013.01); *G06F 16/901* (2019.01)

(58) Field of Classification Search
CPC .................................................. G06F 11/0772
USPC ............................................ 714/37; 701/329
See application file for complete search history.

(56) References Cited

U.S. PATENT DOCUMENTS

| | | | |
|---|---|---|---|
| 6,141,610 A * | 10/2000 | Rothert | G07C 5/008 340/438 |
| 7,523,349 B2 | 4/2009 | Barras | |
| 7,536,370 B2 | 5/2009 | Masurkar | |
| 9,555,800 B2 | 1/2017 | Hynes et al. | |
| 9,972,375 B2 | 5/2018 | Parks et al. | |
| 2004/0181325 A1* | 9/2004 | Rodriguez | F02D 41/26 701/33.7 |
| 2004/0249986 A1* | 12/2004 | Minowa | F02D 37/02 710/1 |
| 2016/0274191 A1* | 9/2016 | Gerdes | G01R 31/343 |
| 2017/0300405 A1* | 10/2017 | Yashayeva | G06F 11/3692 |
| 2017/0365996 A1* | 12/2017 | Katrak | G01R 19/16576 |
| 2018/0293816 A1* | 10/2018 | Garrett | B60R 16/0234 |
| 2020/0164891 A1* | 5/2020 | Bender | B60W 50/0097 |

* cited by examiner

*Primary Examiner* — Chae M Ko
(74) *Attorney, Agent, or Firm* — Buckert Patent & Trademark Law Firm PC; John F. Buckert

(57) ABSTRACT

A diagnostic system for a vehicle electrical system is provided. The diagnostic system includes a microcontroller having microcontroller core components. A first diagnostic handler application sends a first index value to the microcontroller core component diagnostic safety application. The microcontroller core component diagnostic safety application accesses a microcontroller core component diagnostic flag in a first table in the RAM if the first index value is equal to a valid index value in a first table. The microcontroller core component diagnostic safety application sends the microcontroller core component diagnostic flag to the first diagnostic handler application.

12 Claims, 18 Drawing Sheets

MASTER MICROCONTROLLER INDEX TABLE 600

| MICROCONTROLLER CORE COMPONENT NAME | INDEX NAME (HEXADECIMAL) | VALID INDEX VALUE (HEXADECIMAL) | |
|---|---|---|---|
| FLASH MEMORY | FIRST INDEX | 8421 | 602 |
| RAM | SECOND INDEX | 1842 | 604 |
| MICROPROCESSOR | THIRD INDEX | 4812 | 606 |
| POWER SUPPLY | FOURTH INDEX | 7EDB | 608 |
| CLOCK | FIFTH INDEX | B7ED | 610 |

FIG. 3

MASTER TABLE FOR MICROCONTROLLER CORE COMPONENT DIAGNOSTIC FLAGS 620

| MICROCONTROLLER CORE COMPONENT DIAGNOSTIC FLAG NAME | VALID INDEX VALUE (HEXADECIMAL) | NON-FAULT VALUE (HEXADECIMAL) | FAULT VALUE (HEXADECIMAL) | |
|---|---|---|---|---|
| FLASH MEMORY DIAGNOSTIC FLAG | 8421 | EBBE | BEEB | 622 |
| RAM DIAGNOSTIC FLAG | 1842 | DEED | EDDE | 624 |
| MICROPROCESSOR DIAGNOSTIC FLAG | 4812 | 7BB7 | B77B | 626 |
| POWER SUPPLY DIAGNOSTIC FLAG | 7EDB | 4114 | 1441 | 628 |
| CLOCK DIAGNOSTIC FLAG | B7ED | 1441 | 4114 | 630 |

FIG. 4

FIRST TABLE - FOR FLASH MEMORY 640

| FIRST VALID INDEX VALUE (HEXADECIMAL) | FLASH MEMORY DIAGNOSTIC FLAG (HEXADECIMAL) | |
|---|---|---|
| 8421 | XXXX | 642 |

FIG. 5

SECOND TABLE - FOR RAM — 650

| SECOND VALID INDEX VALUE (HEXADECIMAL) | RAM DIAGNOSTIC FLAG (HEXADECIMAL) |
|---|---|
| 1842 | XXXX |

THIRD TABLE - FOR MICROPROCESSOR — 660

| THIRD VALID INDEX VALUE (HEXADECIMAL) | MICROPROCESSOR DIAGNOSTIC FLAG (HEXADECIMAL) |
|---|---|
| 4812 | XXXX |

FOURTH TABLE - FOR POWER SUPPLY — 670

| FOURTH VALID INDEX VALUE (HEXADECIMAL) | POWER SUPPLY DIAGNOSTIC FLAG (HEXADECIMAL) |
|---|---|
| 7EDB | XXXX |

FIFTH TABLE - FOR CLOCK — 680

| FIFTH VALID INDEX VALUE (HEXADECIMAL) | CLOCK DIAGNOSTIC FLAG (HEXADECIMAL) |
|---|---|
| B7ED | XXXX |

DIAGNOSTIC SYSTEM FOR A VEHICLE ELECTRICAL SYSTEM

BACKGROUND

In diagnostic systems for vehicle electrical systems, when two diagnostic handler applications directly access a diagnostic flag in a random access memory (RAM), there exists a possibility that one of the diagnostic handler applications could inadvertently overwrite the memory diagnostic flag to an invalid value.

The inventor herein has recognized a need for an improved diagnostic system for a vehicle electrical system that eliminates the above-mentioned problem.

SUMMARY

A diagnostic system for a vehicle electrical system is provided. The diagnostic system includes a microcontroller having microcontroller core components, a first diagnostic handler application, and a microcontroller core component diagnostic safety application. The first diagnostic handler application sends a first index value to the microcontroller core component diagnostic safety application. The first index value is associated with a first microcontroller core component of the microcontroller core components. The microcontroller core component diagnostic safety application accesses a microcontroller core component diagnostic flag in a first table in a RAM if the first index value is equal to a valid index value in the first table. The microcontroller core component diagnostic flag has a first fault value if any of a plurality of diagnostic flags indicate a fault condition in the first microcontroller core component. The microcontroller core component diagnostic flag has a first non-fault value if all of the plurality of diagnostic flags indicate a non-fault condition in the first microcontroller core component. The first index value, the first fault value, and the first non-fault value each have a Hamming distance of at least eight from one another. The microcontroller core component diagnostic safety application sends the microcontroller core component diagnostic flag to the first diagnostic handler application.

BRIEF DESCRIPTION OF THE DRAWINGS

FIG. 3 is a master microcontroller index table having a plurality of records in which each record has a microcontroller core component name, an index name, and a valid index value;

FIG. 4 is a master table for microcontroller core component diagnostic flags having a plurality of records in which each record has a microcontroller core component diagnostic flag name, a valid index value, and non-fault value, and a fault value;

FIG. 5 is a first table associated with a flash memory having a record with a first valid index value and a flash memory diagnostic flag;

FIG. 6 is a second table associated with a RAM having a record with a second valid index value and a RAM memory diagnostic flag;

FIG. 7 is a third table associated with a microprocessor having a record with a third valid index value and a microprocessor diagnostic flag;

FIG. 8 is a fourth table associated with a power supply having a record with a fourth valid index value and a power supply diagnostic flag;

FIG. 9 is a fifth table associated with a clock having a record with a fifth valid index value and a clock diagnostic flag.

DETAILED DESCRIPTION

Figure 1:
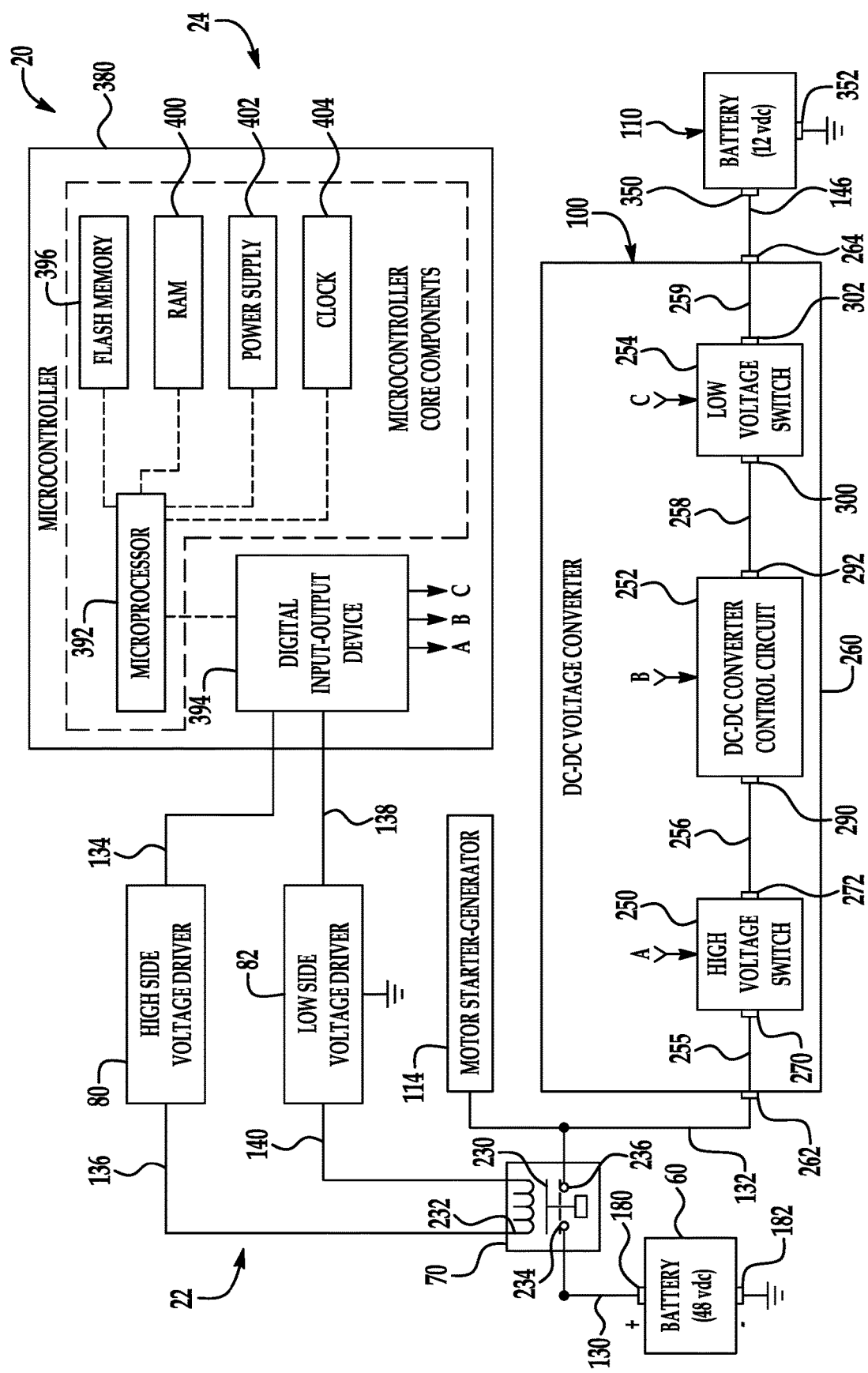
FIG. 1 is a schematic of a vehicle having a diagnostic system for a vehicle electrical system in accordance with an exemplary embodiment.

Referring to FIG. 1, a vehicle 20 is provided. The vehicle 20 includes a vehicle electrical system 22, and a diagnostic system 24 in accordance with an exemplary embodiment.

The vehicle electrical system 22 includes a battery 60, a contactor 70, a high side voltage driver 80, a low side voltage driver 82, a DC-DC voltage converter 100, a battery 110, a motor starter-generator 114, and electrical lines 130, 132, 134, 136, 138, 140, 146.

An advantage of the diagnostic system 24 is that the system 24 utilizes a diagnostic handler application that sends an index value to a microcontroller core component diagnostic safety application, and in response the microcontroller core component diagnostic safety application accesses a diagnostic flag in RAM and sends the diagnostic flag to the diagnostic handler application. Further, the diagnostic handler application can take safe action if the diagnostic flag indicates a fault condition. By utilizing the index value, the diagnostic handler application cannot directly access the diagnostic flag in the RAM which prevents the diagnostic handler application from inadvertently overwriting the diagnostic flag in the RAM.

The term "node" or "electrical node" refers to a region or a location in an electrical circuit.

The term "IC" refers to an integrated circuit.

The term "microcontroller core component" refers to at least one of a microprocessor, a flash memory, a RAM, an internal power supply, and a clock utilized in a microcontroller.

The term "diagnostic safety mechanism" refers to an application executed during a startup operation of the microcontroller that can access a plurality of diagnostic flags that may indicate a fault condition of a microcontroller core component during the startup operation of the microcontroller, and can thereafter set a microcontroller core component diagnostic flag to either a fault value if any of the plurality of diagnostic flags indicate a fault condition, or a non-fault value if all of the plurality of diagnostic flags indicate a non-fault condition.

The term "diagnostic handler application" refers to an application that can take safe action (e.g., open a contactor, open a high voltage switch, open a low voltage switch) in a vehicle electrical system if a fault condition is detected in a microcontroller core component of the microcontroller 380.

The battery 60 includes a positive terminal 180 and a negative terminal 182. In an exemplary embodiment, the battery 60 generates substantially 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the high voltage terminal 262 of the DC-DC voltage converter 100 utilizing the electrical line 132. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 144 energizes the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The motor starter-generator 114 is electrically coupled to the DC-DC voltage converter utilizing the electrical line 132.

The DC-DC voltage converter 100 includes a high voltage switch 250, a DC-DC converter control circuit 252, a low voltage switch 254, electrical lines 255, 256, 258, 259, a housing 260, a high voltage terminal 262, and a low voltage terminal 264. The housing 260 holds the high voltage switch 250, the DC-DC converter control circuit 252, and the low voltage switch 254 therein.

The high voltage switch 250 includes a first node 270 and a second node 272. The first node 270 is electrically coupled to the high voltage terminal 262 utilizing the electrical line 255, and the high voltage terminal 262 is further electrically coupled to the second node 236 of the contactor 70 utilizing the electrical line 132. The second node 272 is electrically coupled to a first node 290 of the DC-DC converter control circuit 252 utilizing the electrical line 256. In an exemplary embodiment, the high voltage switch 250 is a bi-directional MOSFET switch having desired voltage and current capabilities. When the microcontroller 380 generates a first control signal that is received by the high voltage switch 250 (or that is received by a controller or a microprocessor within the DC-DC voltage converter 100 that is operably coupled to the switch 250), the microcontroller 380 induces the switch 250 to transition to a closed operational state. When the microcontroller 380 generates a second control signal, the microcontroller 380 induces the switch 250 to transition to an open operational state. In an exemplary embodiment, the second control signal is a ground level control signal.

The DC-DC converter control circuit 252 has a first node 290 and a second node 292. The DC-DC converter control circuit 252 has internal FETs that are selectively switched to convert a DC voltage received at the first node 290 to another DC voltage output at the second node 292, based on control signals from the microcontroller 380. Alternately, the DC-DC converter control circuit 252 selectively switches the internal FETs to convert a DC voltage received at the second node 292 to another DC voltage that is output at the first node 290, based on control signals from the microcontroller 380.

The low voltage switch 254 includes a first node 300 and a second node 302. The first node 300 is electrically coupled to the second node 292 of the DC-DC converter control circuit 252 utilizing the electrical line 258. The second node 302 is electrically coupled to the low voltage terminal 264 utilizing the electrical line 259, and the low voltage terminal 264 is further electrically coupled to the battery 110 utilizing the electrical line 146. In an exemplary embodiment, the low voltage switch 254 has an identical structure as the high voltage switch 250. In an exemplary embodiment, the low voltage switch 254 is a bi-directional MOSFET switch having desired voltage and current capabilities. When the microcontroller 380 generates a first control signal that is received by the low voltage switch 254 (or that is received by a controller or a microprocessor within the DC-DC voltage converter 100 that is operably coupled to the switch 254), the microcontroller 380 induces the switch 254 to transition to a closed operational state. When the microcontroller 380 generates a second control signal, the microcontroller 380 induces the switch 254 to transition to an open operational state. In an exemplary embodiment, the second control signal is a ground level control signal.

The battery 110 includes a positive terminal 350 and a negative terminal 352. In an exemplary embodiment, the battery 110 generates substantially 12 Vdc between the positive terminal 350 and the negative terminal 352. The positive terminal 350 is electrically coupled to the low voltage terminal 264 of the DC-DC voltage converter 100. The negative terminal 352 is electrically coupled to an electrical ground, which may be electrically isolated from the electrical ground associated with the battery 60.

The diagnostic system 24 is provided to determine whether microcontroller core components within the microcontroller 380 of the electrical system 20 are operating as desired, and if not, to take safe action to by transitioning the contactor 70 to an open operational state, and to transition the high voltage switch 250 and the low voltage switch 254 in the DC-DC voltage converter 100 to an open operational state. The diagnostic system 24 includes the microcontroller 380 and the digital input-output device 394.

The microcontroller 380 is provided to perform self-diagnostic methods to determine whether the microcontroller 380 is operating as desired, and if not, to take safe action. The microcontroller 380 has the microcontroller core components including a microprocessor 392, a flash memory device 396, a RAM 400, a power supply 402, and a clock 404. The microcontroller 380 further includes the digital input-output device 394. The operation of the microprocessor 392 will be discussed in greater detail in the flowcharts hereinafter.

The microprocessor 392 is operably coupled to the digital input-output device 394, the flash memory device 396, the RAM 400, the power supply 402, and the clock 404.

The digital input-output device 394 is electrically coupled to the high side voltage driver 80 and the low side voltage driver 82 via the electrical lines 134, 138 respectively for controlling operation thereof. Further, the digital input-output device 394 is electrically coupled to the high voltage switch 250, the DC-DC converter control circuit 252, and the low voltage switch 254 for controlling operation thereof.

Figure 2:
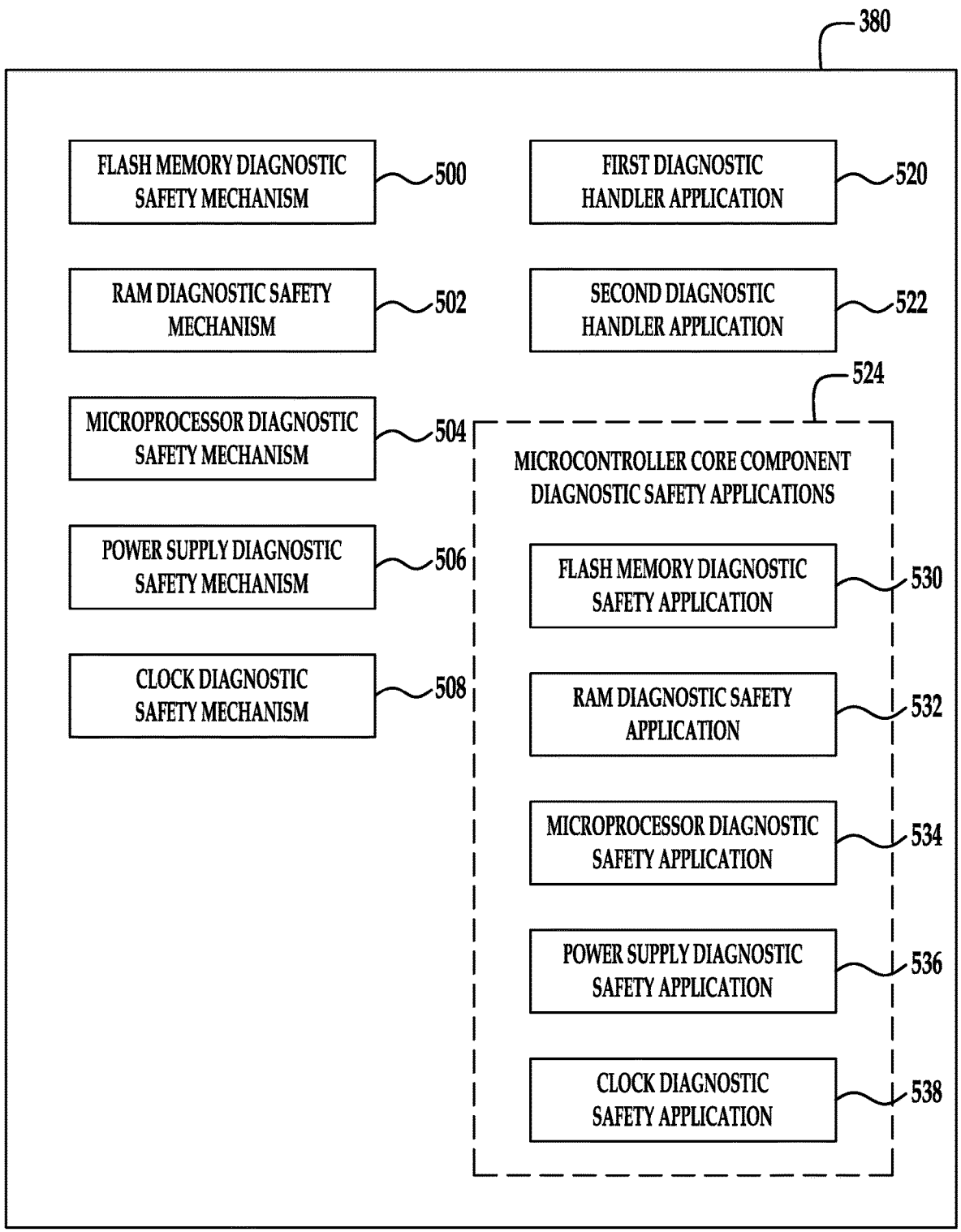
FIG. 2 is a block diagram of applications utilized by the diagnostic system of FIG. 1 including a flash memory diagnostic safety mechanism, a RAM diagnostic safety mechanism, a microprocessor diagnostic safety mechanism, a power supply diagnostic safety mechanism, a clock diagnostic safety mechanism, a first diagnostic handler application, a second diagnostic handler application, and microcontroller core component diagnostic safety applications including a flash memory diagnostic safety application, a RAM diagnostic safety application, a microprocessor diagnostic safety application, a power supply diagnostic safety application, a clock diagnostic safety application.
Figure 10:
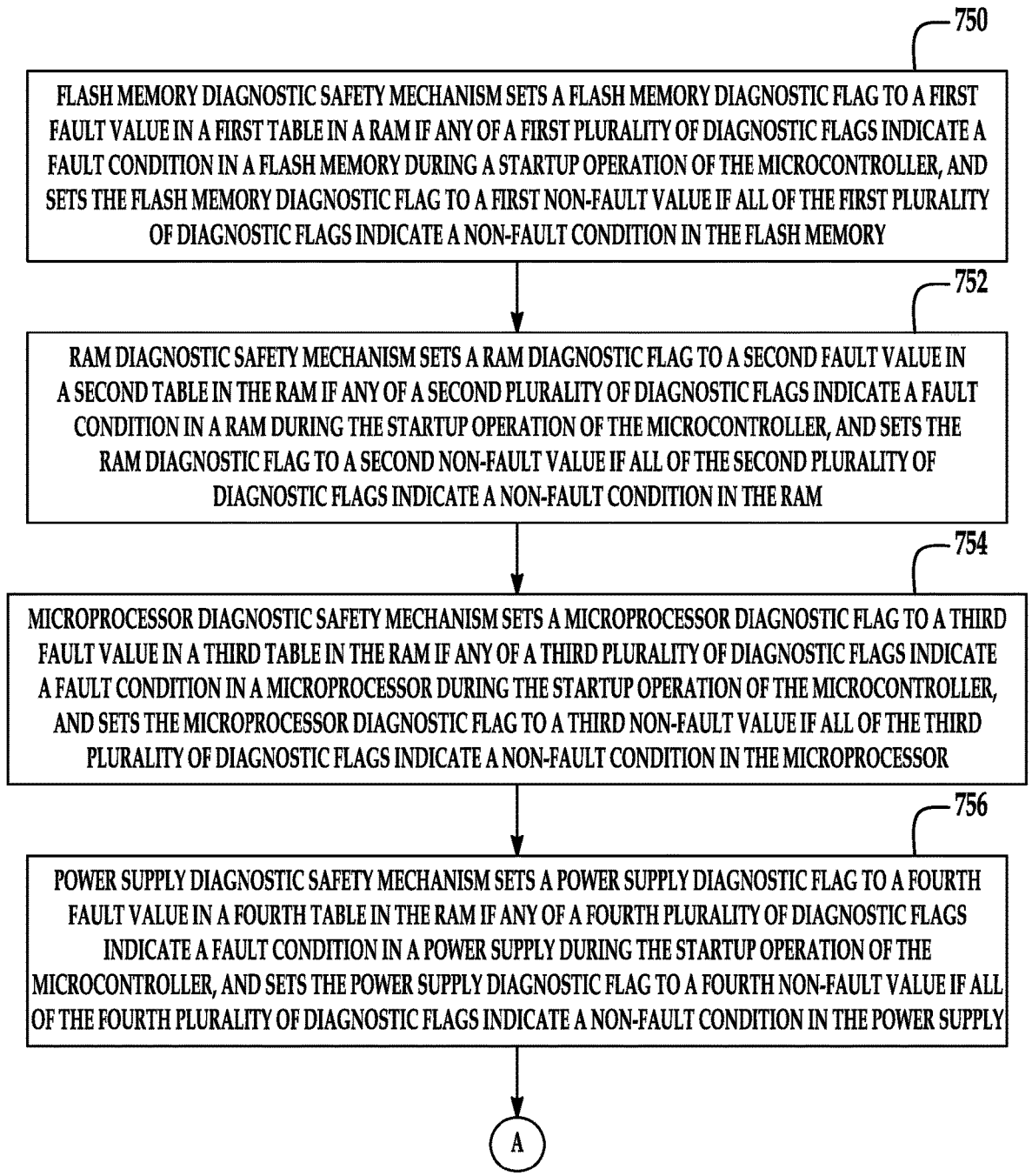
FIGS. 10-23 are flowcharts of a diagnostic method implemented by the diagnostic system of FIG. 1.
Figure 11:
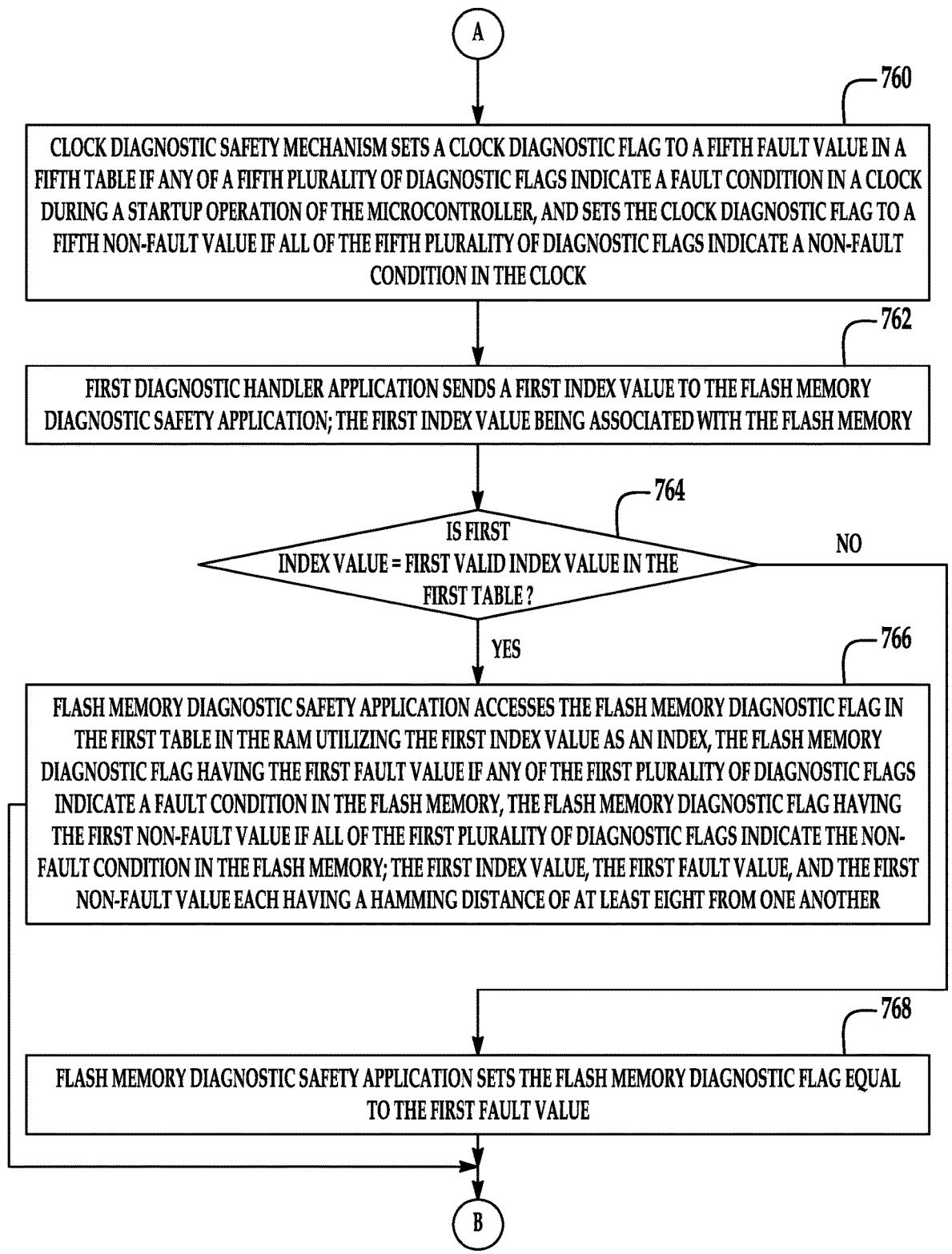
Figure 12:
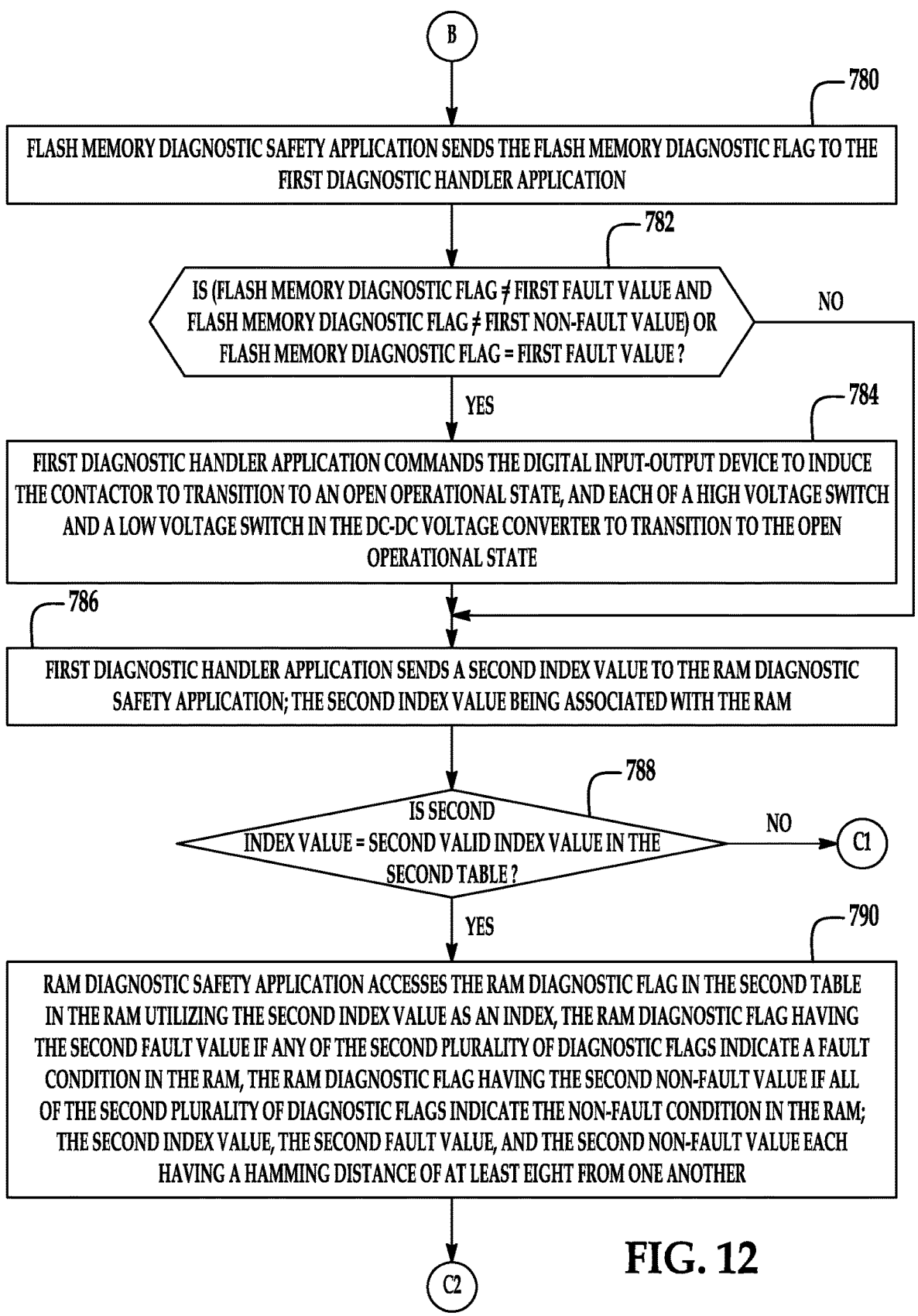
Figure 13:
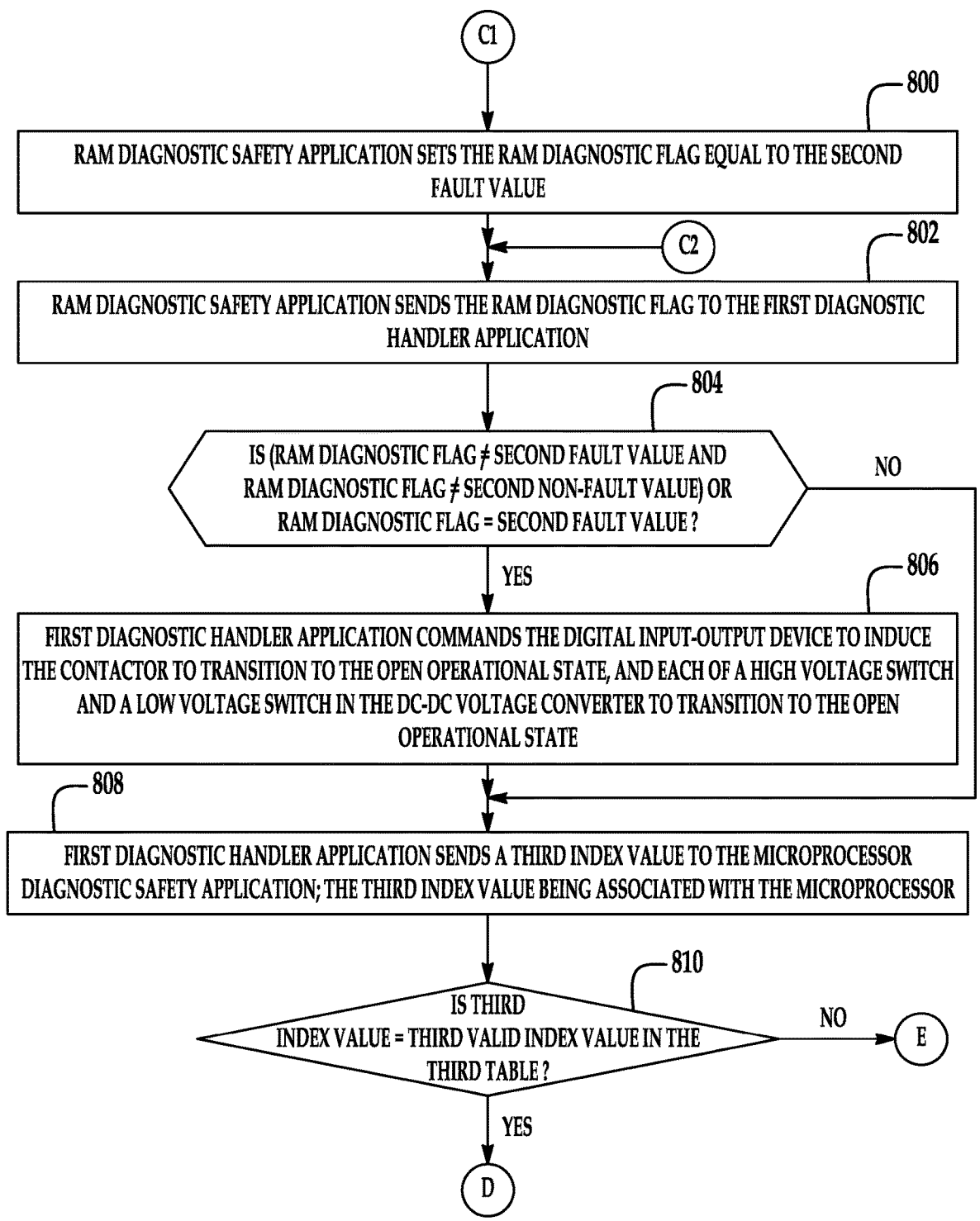
Figure 14:
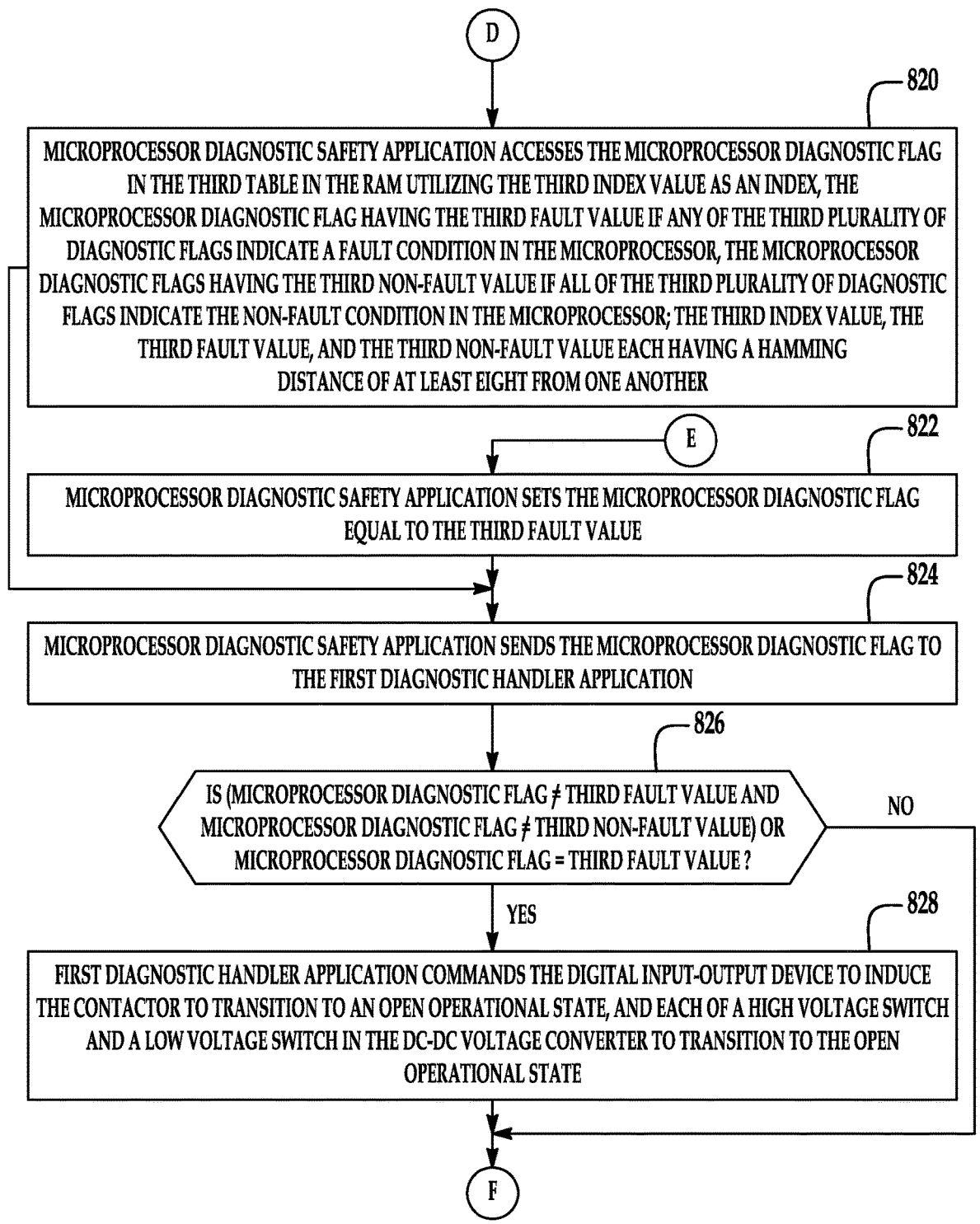
Figure 15:
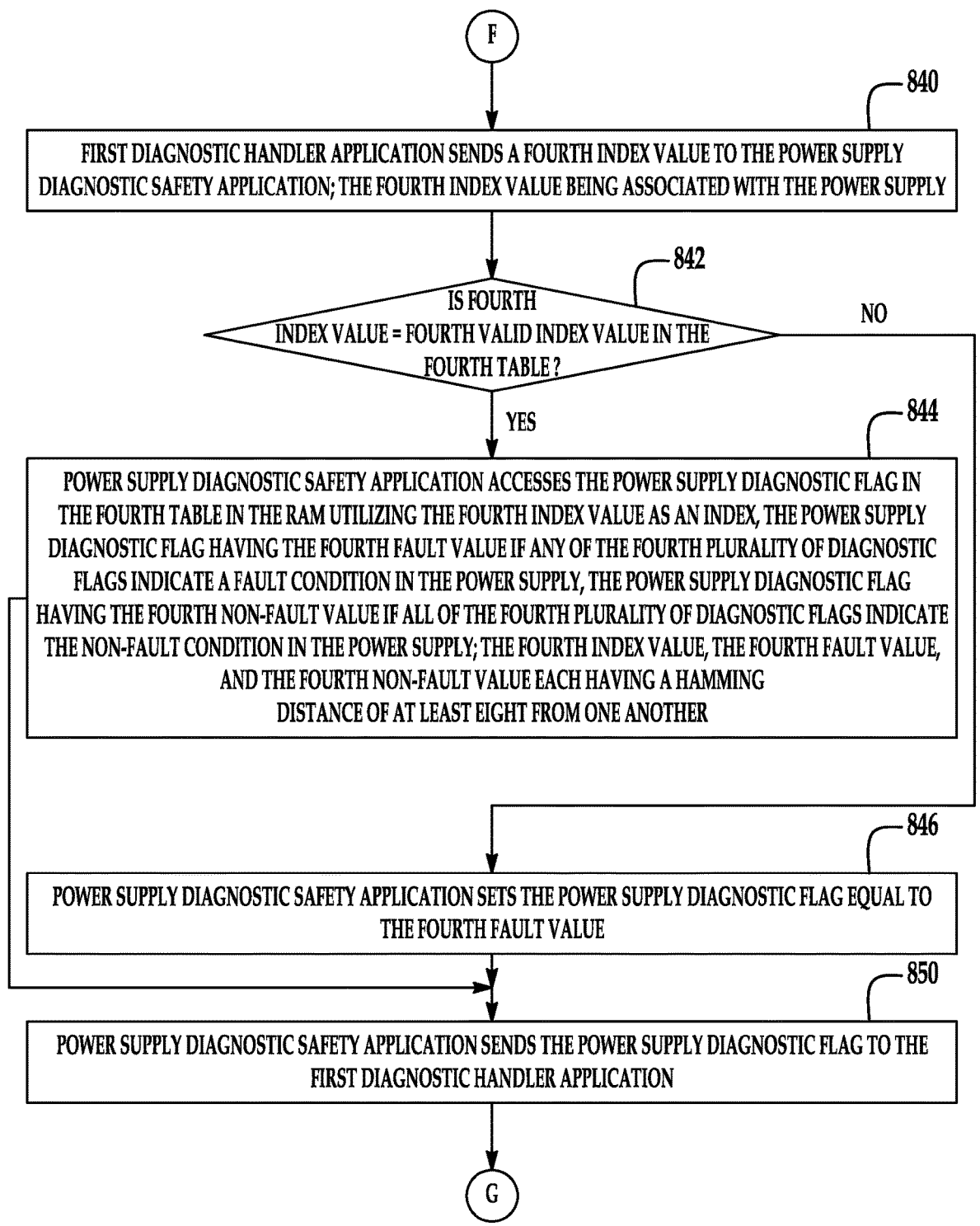
Figure 16:
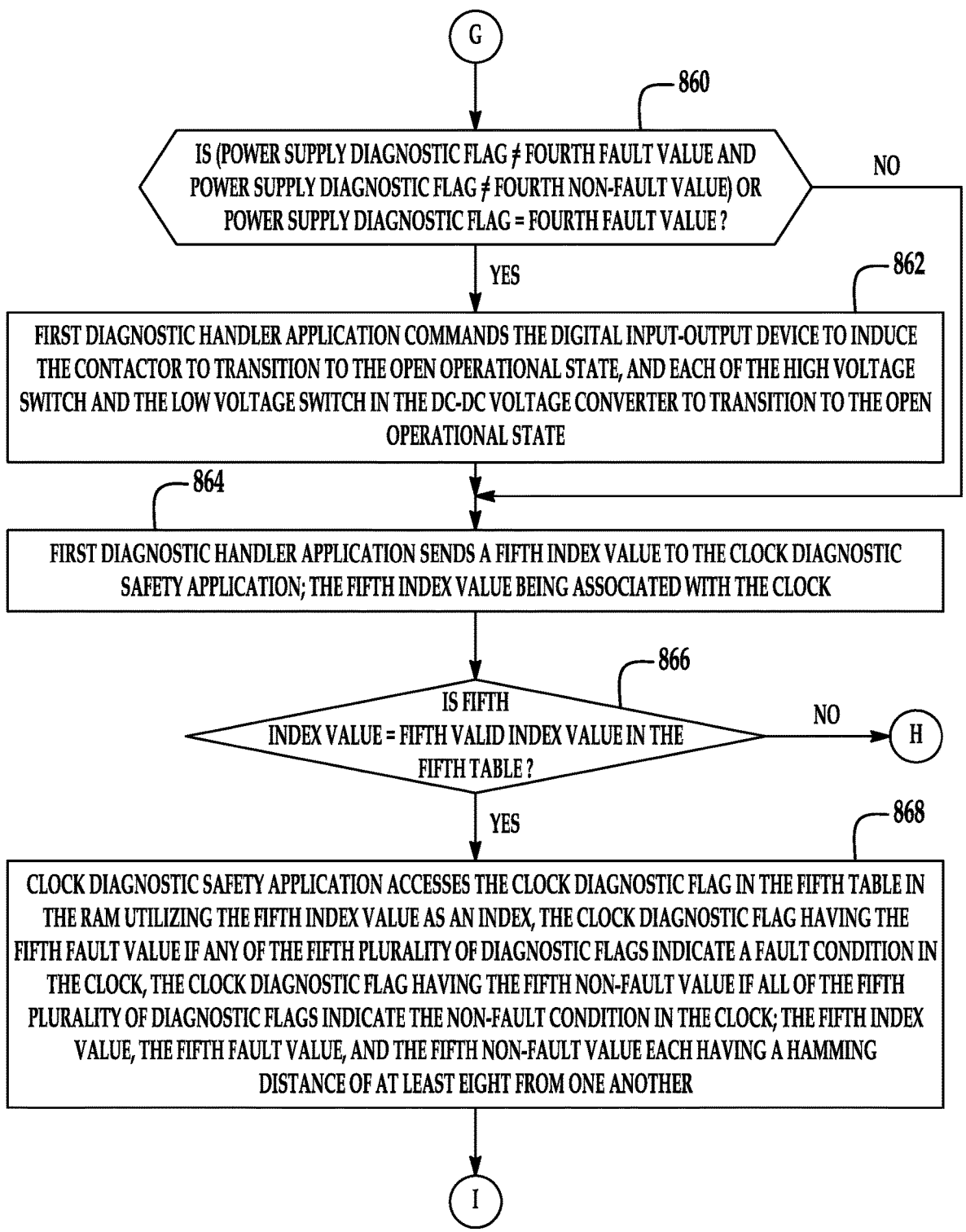
Figure 17:
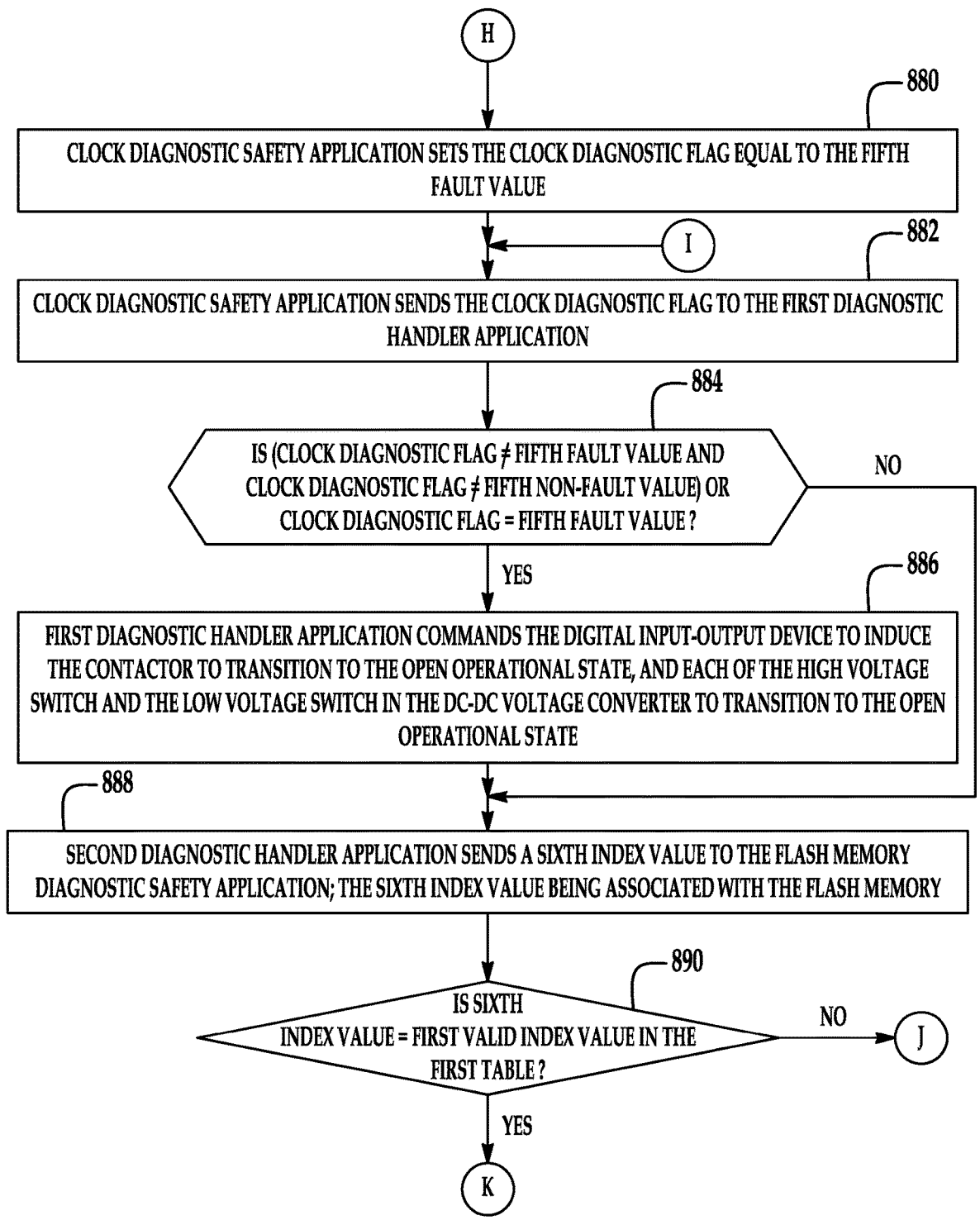
Figure 18:
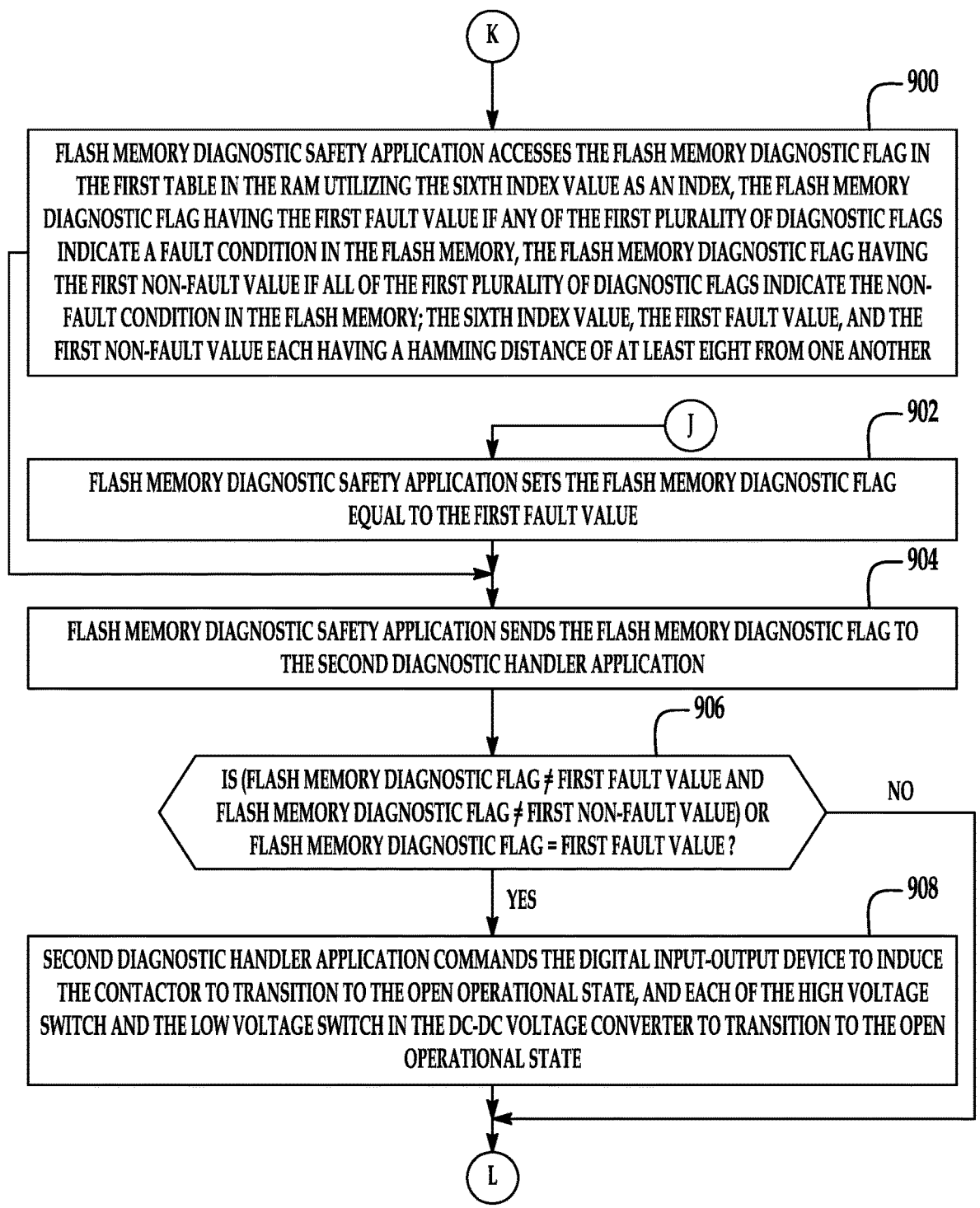
Figure 19:
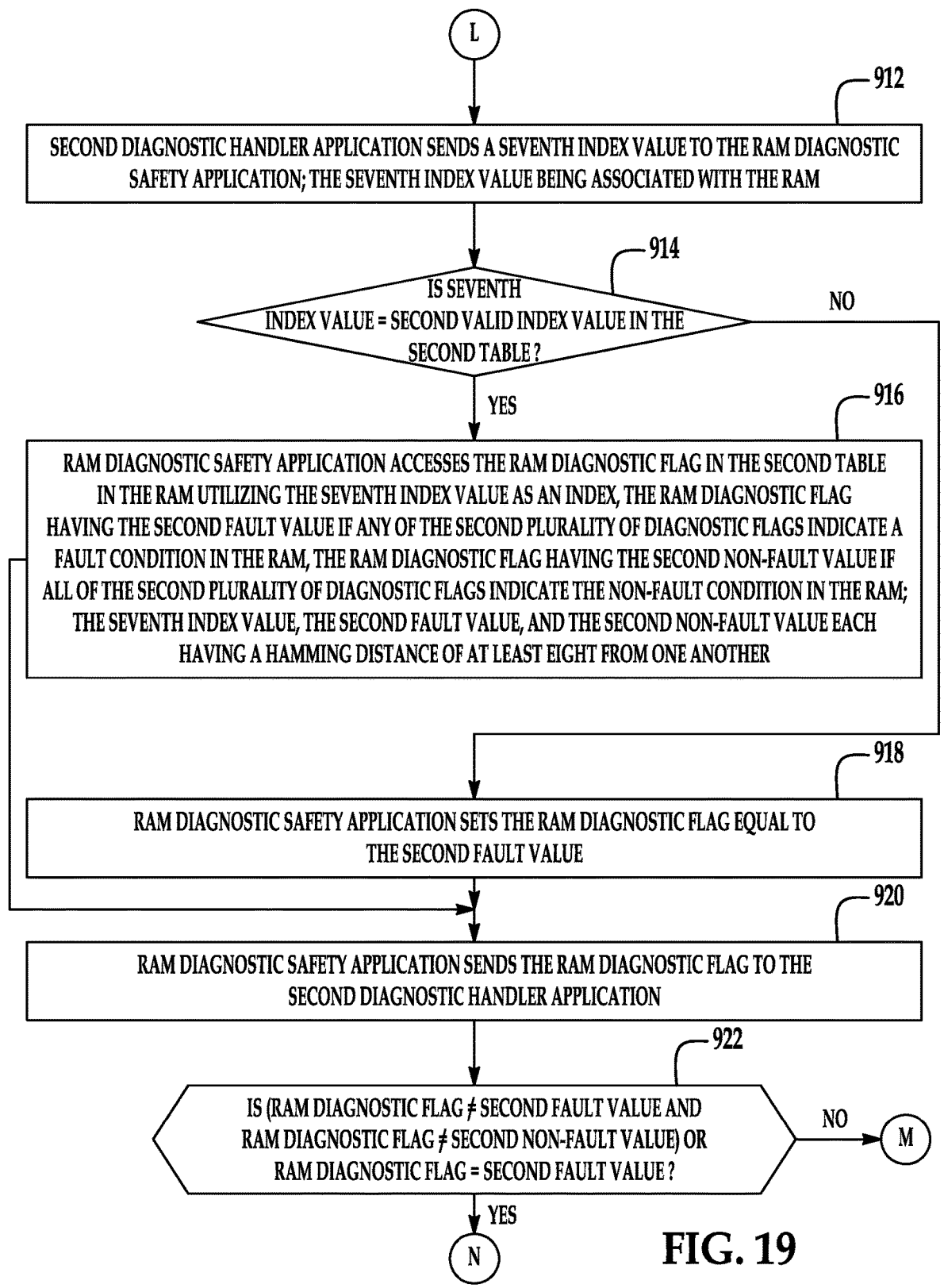
Figure 20:
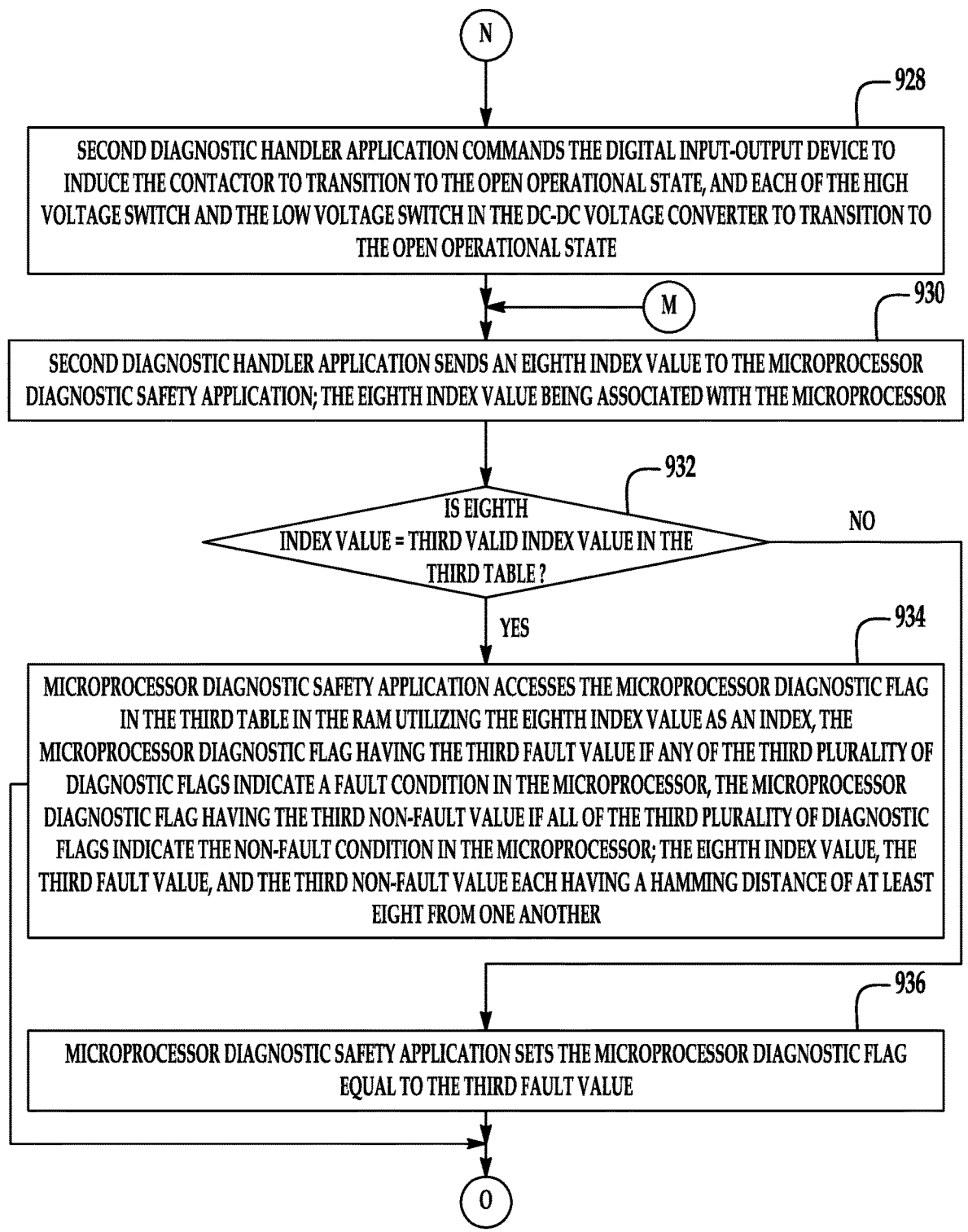
Figure 21:
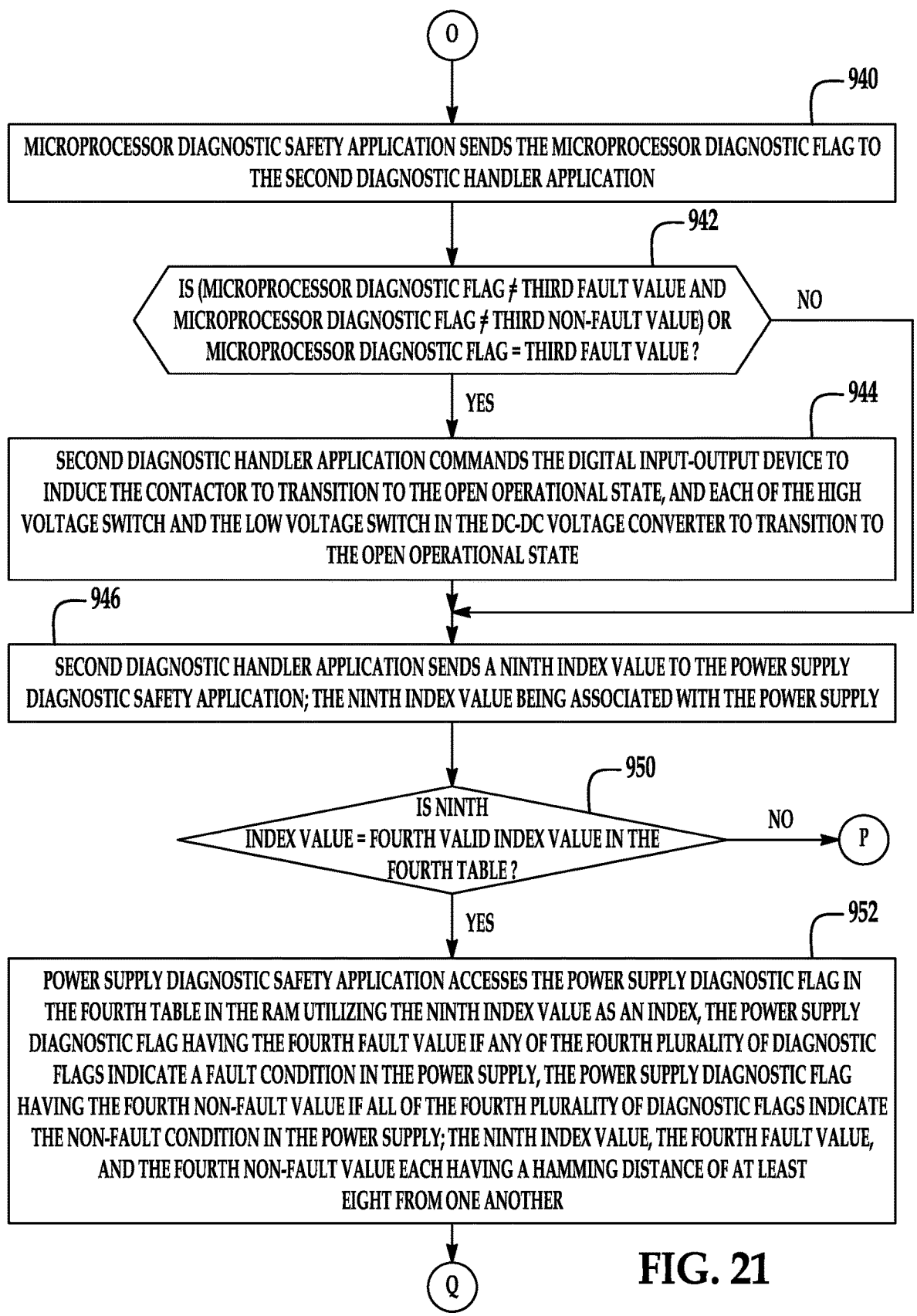
Figure 22:
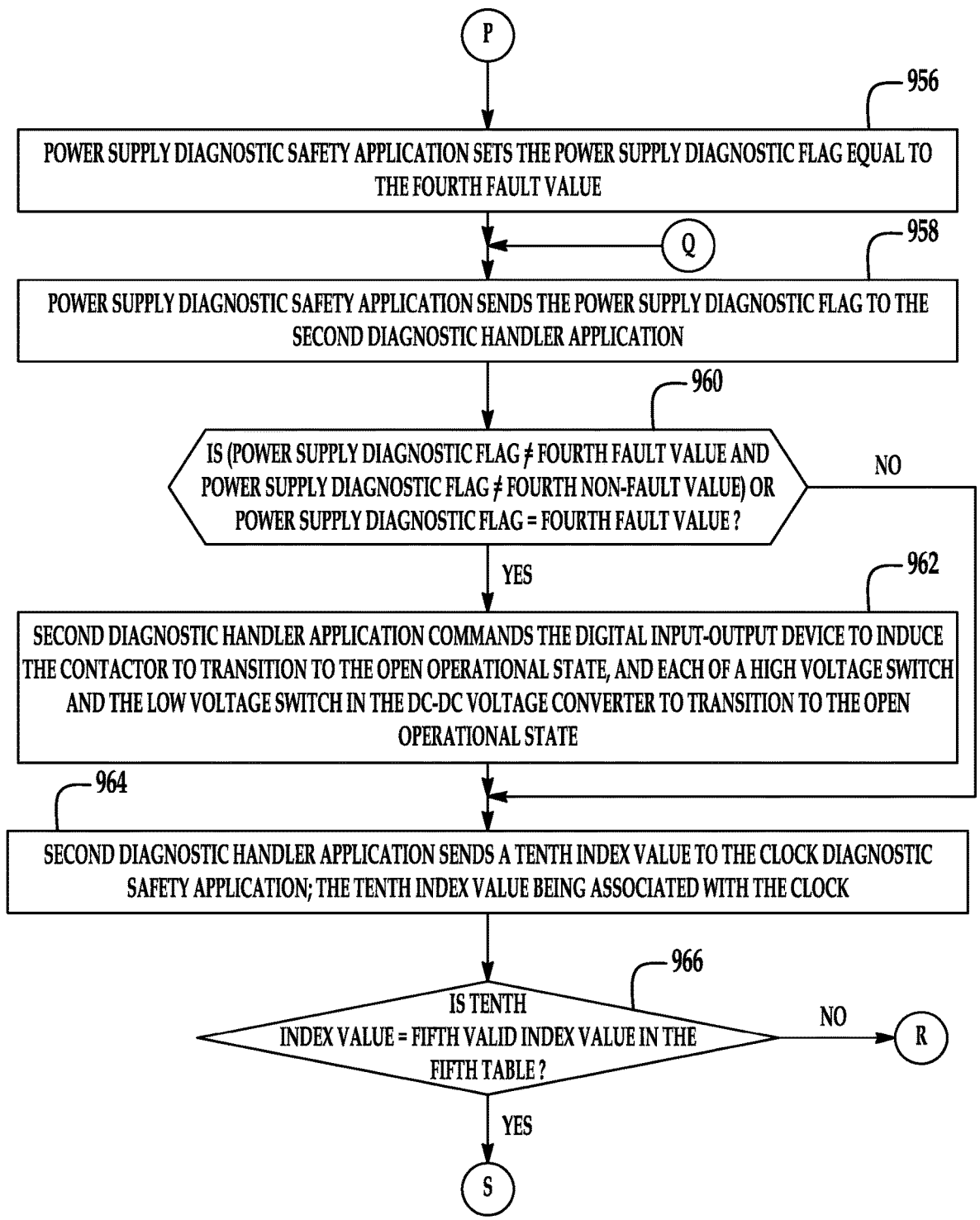
Figure 23:
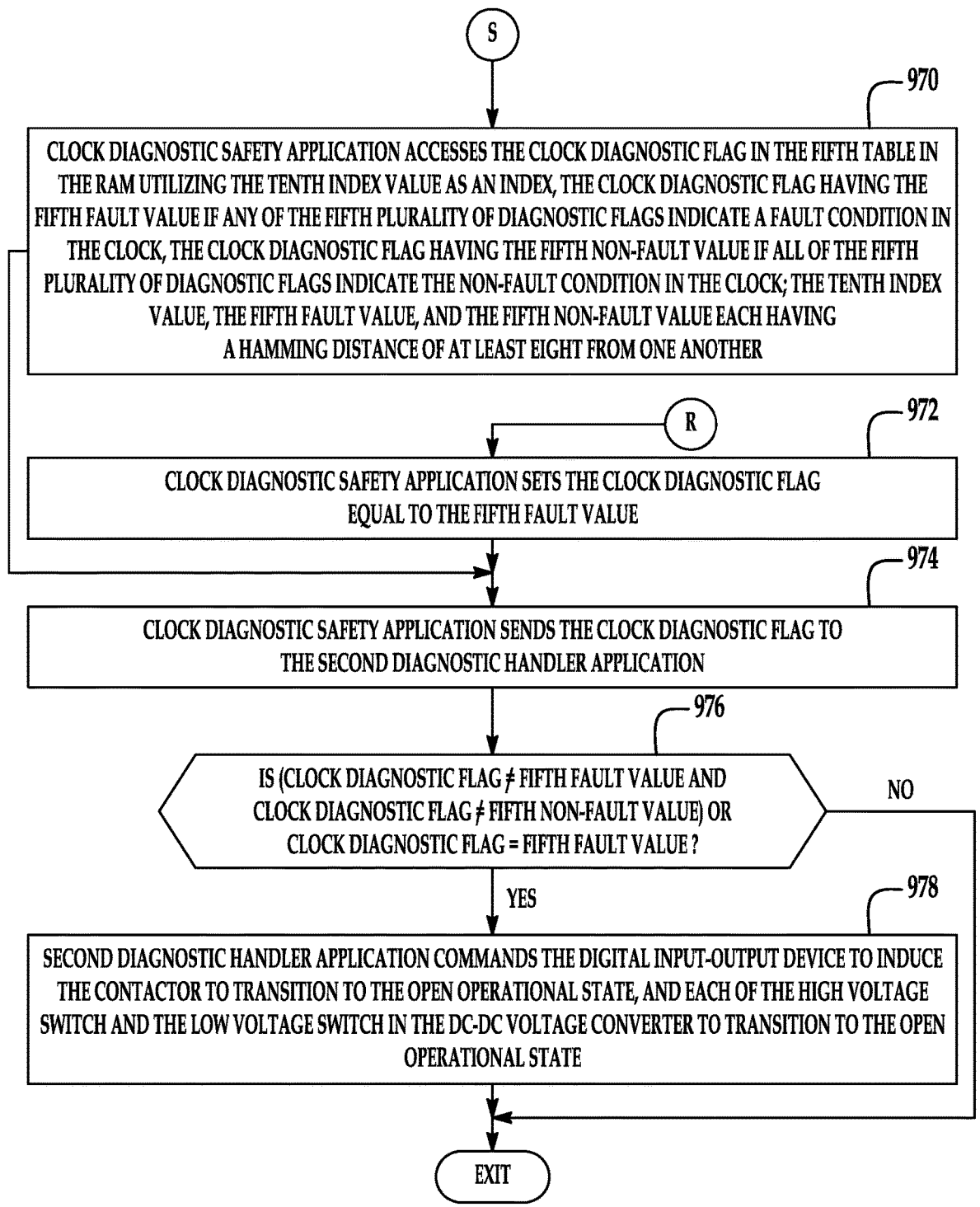

Referring to FIGS. 1 and 2, the RAM memory 400 includes a flash memory diagnostic safety mechanism 500, a RAM diagnostic safety mechanism 502, a microprocessor diagnostic safety mechanism 504, a power supply diagnostic safety mechanism 506, a clock diagnostic safety mechanism 508, a first diagnostic handler application 520, a second diagnostic handler application 522. The RAM memory 400 further includes the microcontroller core component diagnostic safety applications 524 including a flash memory diagnostic safety application 530, a RAM diagnostic safety application 532, a microprocessor diagnostic safety application 534, a power supply diagnostic safety application 536, and a clock diagnostic safety application 538. The functionality of the above-identified mechanisms and applications will be described in the flowchart herein.

Referring to FIG. 3, for understanding how valid index values are associated with the microcontroller core components, a master microcontroller index table 600 having the records 602, 604, 606, 608, 610 is illustrated. Each of the records have the following fields: a microcontroller core component name, an index name, and a valid index value. In particular, the record 602 has a microcontroller core component name of "flash memory, an index name of "first index", and a valid index value of "8421" hexadecimal. The record 604 has a microcontroller core component name of "RAM, an index name of "second index", and a valid index value of "1842" hexadecimal. Further, the record 606 has a microcontroller core component name of "microprocessor", an index name of "third index", and a valid index value of "4812" hexadecimal. Also, the record 608 has a microcontroller core component name of "power supply", an index name of "fourth index", and a valid index value of "7EDB" hexadecimal. Further, the record 610 has a microcontroller core component name of "power supply", an index name of "fourth index", and a valid index value of "7EDB" hexadecimal.

The tables utilized by the above-identified applications will now be described.

Referring to FIG. 4, a master table 620 for microcontroller core component diagnostic flags that is stored in the RAM 400 and utilized by the microprocessor 392 is illustrated. The master table 620 has records 622, 624, 626, 628, 630. Each of the records have the following fields: a microcontroller core component diagnostic flag name, a valid index value, a non-fault value, and a fault value. Each valid index value, non-fault value, and fault value in a respective record has a Hamming distance of at least eight from one another which allows any inadvertent overwrite of this data to be detected.

In an exemplary embodiment, the record 622 has a microcontroller core component diagnostic flag name of "flash memory diagnostic flag, a valid index value of "8421" hexadecimal, a non-fault value of "EBBE" hexadecimal, and a fault value of "BEEB" hexadecimal. The record 624 has a microcontroller core component diagnostic flag name of "RAM diagnostic flag", a valid index value of "1842" hexadecimal, a non-fault value of "DEED" hexadecimal, and a fault value of "EDDE" hexadecimal. Also, the record 626 has a microcontroller core component diagnostic flag name of "microprocessor diagnostic flag", a valid index value of "4812" hexadecimal, a non-fault value of "7BB7" hexadecimal, and a fault value of "B77B" hexadecimal. Further, the record 628 has a microcontroller core component diagnostic flag name of "power supply diagnostic flag", a valid index value of "7EDB" hexadecimal, a non-fault value of "4114" hexadecimal, and a fault value of "1441" hexadecimal. The record 630 has a microcontroller core component diagnostic flag name of "clock diagnostic flag", a valid index value of "B7ED" hexadecimal, a non-fault value of "1441" hexadecimal, and a fault value of "4114" hexadecimal.

Referring to FIG. 5, a first table 640 associated with the flash memory 396, that is stored in the RAM 400 and utilized by the microprocessor 392 is illustrated. The first table 640 has a record 642 with a first valid index value of "8421" hexadecimal, and a flash memory diagnostic flag. The flash memory diagnostic flag has a value of "EBBE" hexadecimal if no-faults have been detected in the flash memory 396, or "BEEB" hexadecimal if a fault has been detected in the flash memory 396 by the flash memory diagnostic mechanism 500.

Referring to FIG. 6, a second table 650 associated with the RAM 400, that is stored in the RAM 400 and utilized by the microprocessor 392 is illustrated. The second table has a record 652 with a second valid index value of "1842" hexadecimal, and a RAM diagnostic flag. The RAM diagnostic flag has a value of "DEED" hexadecimal if no-faults have been detected in the RAM 400, or "EDDE" hexadecimal if a fault has been detected in the RAM 400 by the RAM diagnostic mechanism 502.

Referring to FIG. 7, a third table 660 associated with the microprocessor 392 that is stored in the RAM 400 and utilized by the microprocessor 392 is illustrated. The third table 660 has a record 662 with a third valid index value of "4812" hexadecimal, and a microprocessor diagnostic flag. The microprocessor diagnostic flag has a value of "7BB7" hexadecimal if no-faults have been detected in the microprocessor 392, or "B77B" hexadecimal if a fault has been detected in the microprocessor 392 by the microprocessor diagnostic mechanism 504.

Referring to FIG. 8, a fourth table 670 associated with the power supply 402 that is stored in the RAM 400 and utilized by the microprocessor 392 is illustrated. The fourth table 670 has a record 672 with a fourth valid index value of "7EDB" hexadecimal, and a power supply diagnostic flag. The power supply diagnostic flag has a value of "4114" hexadecimal if no-faults have been detected in the power supply 402, or "1441" hexadecimal if a fault has been detected in the power supply 402 by the power supply diagnostic mechanism 506.

Referring to FIG. 9, a fifth table 680 associated with the clock 404 that is stored in the RAM 400 and utilized by the microprocessor 392 is illustrated. The fifth table 680 has a record 682 with a fifth valid index value of "B7ED" hexadecimal, and a clock diagnostic flag. The clock diagnostic flag has a value of "1441" hexadecimal if no-faults have been detected in the clock 404, or "4114" hexadecimal if a fault has been detected in the clock 404 by the clock diagnostic mechanism 508.

Referring to FIGS. 1, 4-9 and 10-23, a flowchart of a diagnostic method implemented by the diagnostic system 24 will be explained.

At step 750, the flash memory diagnostic safety mechanism 500 sets a flash memory diagnostic flag to a first fault value (e.g., BEEB hexadecimal) in a first table 640 (shown in FIG. 5) in a RAM 400 if any of a first plurality of diagnostic flags indicate a fault condition in a flash memory 396 during a startup operation of the microcontroller 380, and sets the flash memory diagnostic flag to a first non-fault value (e.g., EBBE hexadecimal) if all of the first plurality of diagnostic flags indicate a non-fault condition in the flash memory 396. After step 750, the method advances to step 752.

At step 752, the RAM diagnostic safety mechanism 502 sets a RAM diagnostic flag to a second fault value (e.g., EDDE hexadecimal) in a second table 650 (shown in FIG. 6) in the RAM 400 if any of a second plurality of diagnostic flags indicate a fault condition in a RAM 400 during the startup operation of the microcontroller 380, and sets the RAM diagnostic flag to a second non-fault value (e.g., DEED hexadecimal) if all of the second plurality of diagnostic flags indicate a non-fault condition in the RAM 400. After step 752, the method advances to step 754.

At step 754, the microprocessor diagnostic safety mechanism 504 sets a microprocessor diagnostic flag to a third fault value (e.g., B77B hexadecimal) in a third table 660 (shown in FIG. 7) in the RAM 400 if any of a third plurality of diagnostic flags indicate a fault condition in a microprocessor 392 during the startup operation of the microcontroller 380, and sets the microprocessor diagnostic flag to a third non-fault value (e.g., 7BB7 hexadecimal) if all of the third plurality of diagnostic flags indicate a non-fault condition in the microprocessor 392. After step 754, the method advances to step 756.

At step 756, the power supply diagnostic safety mechanism 506 sets a power supply diagnostic flag to a fourth fault value (e.g., 1441 hexadecimal) in a fourth table 670 (shown in FIG. 8) in the RAM 400 if any of a fourth plurality of diagnostic flags indicate a fault condition in a power supply 402 during the startup operation of the microcontroller 380, and sets the power supply diagnostic flag to a fourth non-fault value (e.g., 4114 hexadecimal) if all of the fourth plurality of diagnostic flags indicate a non-fault condition in the power supply 402. After step 756, the method advances to step 760.

At step 760, the clock diagnostic safety mechanism 508 sets a clock diagnostic flag to a fifth fault value (e.g., 4114 hexadecimal) in a fifth table 680 (shown in FIG. 9) if any of a fifth plurality of diagnostic flags indicate a fault condition in a clock 404 during a startup operation of the microcontroller 380, and sets the clock diagnostic flag to a fifth non-fault value (e.g., 1441 hexadecimal) if all of the fifth plurality of diagnostic flags indicate a non-fault condition in the clock 404. After step 760, the method advances to step 762.

At step 762, the first diagnostic handler application 520 sends a first index value (e.g., 8421 hexadecimal) to the flash memory diagnostic safety application 530. The first index value is associated with the flash memory 396. After step 762, the method advances to step 764.

At step 764, the microprocessor 392 makes a determination as to whether the first index value is equal to the first valid index value in the first table 640. If the value of step 764 equals "yes", the method advances to step 766. Otherwise, the method advances to step 768.

At step 766, the flash memory diagnostic safety application 530 accesses the flash memory diagnostic flag in the first table 640 in the RAM 400 utilizing the first index value (e.g., 8421 hexadecimal) as an index. The flash memory diagnostic flag has the first fault value (e.g., BEEB hexadecimal) if any of the first plurality of diagnostic flags indicate a fault condition in the flash memory 396. The flash memory diagnostic flag has the first non-fault value (e.g., EBBE hexadecimal) if all of the first plurality of diagnostic flags indicate the non-fault condition in the flash memory 396. The first index value, the first fault value, and the first non-fault value each have a Hamming distance of at least eight from one another. After step 766, the method advances to step 780.

Referring again to step 764, if the value of step 764 equals "no", the method advances to step 768. At step 768, the flash memory diagnostic safety application 530 sets the flash memory diagnostic flag equal to the first fault value (e.g., BEEB hexadecimal) since an invalid index value was received. After step 768, the method advances to step 780.

At step 780, the flash memory diagnostic safety application 530 sends the flash memory diagnostic flag to the first diagnostic handler application 520. After step 780, the method advances to step 782.

At step 782, the microprocessor 392 makes a determination as to whether the flash memory diagnostic flag is not equal to the first fault value and the flash memory diagnostic flag is not equal to the first non-fault value, or the flash memory diagnostic flag is equal to the first fault value. If the value of step 782 equals "yes", the method advances to step 784. Otherwise, the method advances to step 786.

At step 784, the first diagnostic handler application 520 commands the digital input-output device 394 to induce the contactor 70 to transition to an open operational state, and each of a high voltage switch 250 and a low voltage switch 254 in the DC-DC voltage converter 100 to transition to the open operational state. After step 784, the method advances to step 786.

At step 786, the first diagnostic handler application 520 sends a second index value (e.g., 1842 hexadecimal) to the RAM diagnostic safety application 532. The second index value is associated with the RAM 400. After step 786, the method advances to step 788.

At step 788, the microprocessor 392 makes a determination as to whether the second index value is equal to the second valid index value in the second table 650. If the value of step 788 equals "yes", the method advances to step 790. Otherwise, the method advances to step 800.

At step 790, the RAM diagnostic safety application 532 accesses the RAM diagnostic flag in the second table 650 in the RAM 400 utilizing the second index value as an index. The RAM diagnostic flag has the second fault value (e.g., EDDE hexadecimal) if any of the second plurality of diagnostic flags indicate a fault condition in the RAM 400. The RAM diagnostic flag has the second non-fault value (e.g., DEED hexadecimal) if all of the second plurality of diagnostic flags indicate the non-fault condition in the RAM 400. The second index value, the second fault value, and the second non-fault value each have a Hamming distance of at least eight from one another. After step 790, the method advances to step 802.

Referring again to step 788, if the value of step 788 equals "no", the method advances to step 800. At step 800, the RAM diagnostic safety application 532 sets the RAM diagnostic flag equal to the second fault value (e.g., EDDE hexadecimal). After step 800, the method advances to step 802.

At step 802, the RAM diagnostic safety application 532 sends the RAM diagnostic flag to the first diagnostic handler application 520. After step 802, the method advances to step 804.

At step 804, the microprocessor 392 makes a determination as to whether the RAM diagnostic flag is not equal to the second fault value and the RAM diagnostic flag is not equal to the second non-fault value, or the RAM diagnostic flag is equal to the second fault value. If the value of step 804 equals "yes", the method advances to step 806. Otherwise, the method advances to step 808.

At step 806, the first diagnostic handler application 520 commands the digital input-output device 394 to induce the contactor 70 to transition to the open operational state, and each of the high voltage switch 250 and the low voltage switch 254 in the DC-DC voltage converter 100 to transition to the open operational state. After step 806, the method advances to step 808.

At step 808, the first diagnostic handler application 520 sends a third index value (e.g., 4812 hexadecimal) to the microprocessor diagnostic safety application 534. The third index value is associated with the microprocessor 392. After step 808, the method advances to step 810.

At step 810, the microprocessor 392 makes a determination as to whether the third index value is equal to the third valid index value in the third table 660. If the value of step 810 equals "yes", the method advances to step 820. Otherwise, the method advances to step 822.

At step 820, the microprocessor diagnostic safety application 534 accesses the microprocessor diagnostic flag in the third table 660 in the RAM 400 utilizing the third index value as an index. The microprocessor diagnostic flag has the third fault value (e.g., B77B hexadecimal) if any of the third plurality of diagnostic flags indicate a fault condition in the microprocessor 392. The microprocessor diagnostic flag has the third non-fault value (e.g., 7BB7 hexadecimal) if all of the third plurality of diagnostic flags indicate the non-fault condition in the microprocessor 392. The third index value, the third fault value, and the third non-fault value each have a Hamming distance of at least eight from one another. After step 820, the method advances to step 824.

Referring again to step 810, if the value of step 810 equals "no", the method advances to step 822. At step 822, the microprocessor diagnostic safety application 534 sets the microprocessor diagnostic flag equal to the third fault value (e.g., B77B hexadecimal). After step 822, the method advances to step 824.

At step 824, the microprocessor diagnostic safety application 534 sends the microprocessor diagnostic flag to the first diagnostic handler application 520. After step 824, the method advances to step 826.

At step 826, the microprocessor 392 makes a determination as to whether the microprocessor diagnostic flag is not equal to the third fault value and the microprocessor diagnostic flag is not equal to the third non-fault value, or the microprocessor diagnostic flag is equal to the third fault value. If the value of step 826 equals "yes", the method advances to step 828. Otherwise, the method advances to step 840.

At step 828, the first diagnostic handler application 520 commands the digital input-output device 394 to induce the contactor 70 to transition to the open operational state, and each of the high voltage switch 250 and the low voltage switch 254 in the DC-DC voltage converter 100 to transition to the open operational state. After step 828, the method advances the step 840.

At step 840, the first diagnostic handler application 520 sends a fourth index value (e.g., 7EDB hexadecimal) to the power supply diagnostic safety application 536. The fourth index value is associated with the power supply 402. After step 840, the method advances to step 842.

At step 842, the microprocessor 392 makes a determination as to whether the fourth index value is equal to the fourth valid index value in the fourth table 670. If the value of step 842 equals "yes", the method advances to step 844. Otherwise, the method advances to step 846.

At step 844, the power supply diagnostic safety application 536 accesses the power supply diagnostic flag in the fourth table 670 in the RAM 400 utilizing the fourth index value (e.g., 7EDB hexadecimal) as an index. The power supply diagnostic flag has the fourth fault value (e.g., 1441 hexadecimal) if any of the fourth plurality of diagnostic flags indicate a fault condition in the power supply 402. The power supply diagnostic flag has the fourth non-fault value (e.g., 4114 hexadecimal) if all of the fourth plurality of diagnostic flags indicate the non-fault condition in the power supply 402. The fourth index value, the fourth fault value, and the fourth non-fault value each have a Hamming distance of at least eight from one another. After step 844, the method advances to step 850.

Referring again to step 842, if the value of step 842 equals "no", the method advances to step 846. At step 846, the power supply diagnostic safety application 536 sets the power supply diagnostic flag equal to the fourth fault value (e.g., 1441 hexadecimal). After step 846, the method advances to step 850.

At step 850, the power supply diagnostic safety application 536 sends the power supply diagnostic flag to the first diagnostic handler application 520. After step 850, the method advances to step 860.

At step 860, the microprocessor 392 makes a determination as to whether the power supply diagnostic flag is not equal to the fourth fault value and the power supply diagnostic flag is not equal to the fourth non-fault value, or the power supply diagnostic flag is equal to the fourth fault value. If the value of step 860 equals "yes", the method advances to step 862. Otherwise, the method advances to step 864.

At step 862, the first diagnostic handler application 520 commands the digital input-output device 394 to induce the contactor 70 to transition to the open operational state, and each of the high voltage switch 250 and the low voltage switch 254 in the DC-DC voltage converter 100 to transition to the open operational state. After step 862, the method advances to step 864.

At step 864, the first diagnostic handler application 520 sends a fifth index value (e.g., B7ED hexadecimal) to the clock diagnostic safety application 538. The fifth index value is associated with the clock 404. After step 864, the method advances to step 866.

At step 866, the microprocessor 392 makes a determination as to whether the fifth index value is equal to the fifth valid index value in the fifth table 680. If the value of step 866 equals "yes", the method advances to step 868. Otherwise, the method advances to step 880.

At step 868, the clock diagnostic safety application 538 accesses the clock diagnostic flag in the fifth table 680 in the RAM 400 utilizing the fifth index value (e.g., B7ED hexadecimal) as an index. The clock diagnostic flag has the fifth fault value (e.g., 4114 hexadecimal) if any of the fifth plurality of diagnostic flags indicate a fault condition in the clock 404. The clock diagnostic flag has the fifth non-fault value (e.g., 1441 hexadecimal) if all of the fifth plurality of diagnostic flags indicate the non-fault condition in the clock 404. The fifth index value, the fifth fault value, and the fifth non-fault value each have a Hamming distance of at least eight from one another. After step 868, the method advances to step 882.

Referring again to step 866, if the value of step 866 equals "no", the method advances to step 880. At step 880, the clock diagnostic safety application 538 sets the clock diagnostic flag equal to the fifth fault value (e.g., 4114 hexadecimal). After step 880, the method advances to step 882.

At step 882, the clock diagnostic safety application 538 sends the clock diagnostic flag to the first diagnostic handler application 520. After step 882, the method advances to step 884.

At step 884, the microprocessor 392 makes a determination as to whether the clock diagnostic flag is not equal to the fifth fault value and the clock diagnostic flag is not equal to the fifth non-fault value, or the clock diagnostic flag is equal to the fifth fault value. If the value of step 884 equals "yes", the method advances to step 886. Otherwise, the method advances to step 888.

At step 886, the first diagnostic handler application 520 commands the digital input-output device 394 to induce the contactor 70 to transition to the open operational state, and each of the high voltage switch 250 and the low voltage switch 254 in the DC-DC voltage converter 100 to transition to the open operational state. After step 886, the method advances to step 888.

At step 888, the second diagnostic handler application 522 sends a sixth index value (e.g., 8421 hexadecimal) to the flash memory diagnostic safety application 530. The sixth index value is associated with the flash memory 396. After step 888, the method advances to step 890.

At step 890, the microprocessor 392 makes a determination as to whether the sixth index value is equal to the first valid index value in the first table 640. If the value of step 890 equals "yes", the method advances to step 900. Otherwise, the method advances to step 902.

At step 900, the flash memory diagnostic safety application 530 accesses the flash memory diagnostic flag in the first table 640 in the RAM 400 utilizing the sixth index value (e.g., 8421 hexadecimal) as an index. The flash memory diagnostic flag has the first fault value (e.g., BEEB hexadecimal) if any of the first plurality of diagnostic flags indicate a fault condition in the flash memory 396. The flash memory diagnostic flag has the first non-fault value (e.g., EBBE hexadecimal) if all of the first plurality of diagnostic flags indicate the non-fault condition in the flash memory 396. The sixth index value, the first fault value, and the first non-fault value each have a Hamming distance of at least eight from one another. After step 900, the method advances to step 904.

Referring again to step 890, if the value of step 890 equals "no", the method advances to step 902. At step 902, the flash memory diagnostic safety application 530 sets the flash memory diagnostic flag equal to the first fault value (e.g., BEEB hexadecimal). After step 902, the method advances to step 904.

At step 904, the flash memory diagnostic safety application 530 sends the flash memory diagnostic flag to the second diagnostic handler application 522. After step 904, the method advances to step 906.

At step 906, the microprocessor 392 makes a determination as to whether the flash memory diagnostic flag is not equal to the first fault value and the flash memory diagnostic flag is not equal to the first non-fault value, or the flash memory diagnostic flag is equal to the first fault value. If the value of step 906 equals "yes", the method advances to step 908. Otherwise, the method advances to step 912.

At step 908, the second diagnostic handler application 522 commands the digital input-output device 394 to induce the contactor 70 to transition to the open operational state, and each of the high voltage switch 250 and the low voltage switch 254 in the DC-DC voltage converter 100 to transition to the open operational state. After step 908, the method advances to step 912.

At step 912, the second diagnostic handler application 522 sends a seventh index value (e.g., 1842 hexadecimal) to the RAM diagnostic safety application 532. The seventh index value is associated with the RAM 400. After step 912, the method advances to step 914.

At step 914, the microprocessor 392 makes a determination as to whether the seventh index value is equal to the second valid index value in the second table 650. If the value of step 914 equals "yes", the method advances to step 916. Otherwise, the method advances to step 918.

At step 916, the RAM diagnostic safety application 532 accesses the RAM diagnostic flag in the second table 650 in the RAM 400 utilizing the seventh index value (e.g., 1842 hexadecimal) as an index. The RAM diagnostic flag has the second fault value (e.g., EDDE hexadecimal) if any of the second plurality of diagnostic flags indicate a fault condition in the RAM 400. The RAM diagnostic flag has the second non-fault value (e.g., DEED hexadecimal) if all of the second plurality of diagnostic flags indicate the non-fault condition in the RAM 400. The seventh index value, the second fault value, and the second non-fault value each have a Hamming distance of at least eight from one another. After step 916, the method advances to step 920.

Referring again to step 914, if the value of step 914 equals "no", the method advances to step 918. At step 918, the RAM diagnostic safety application 532 sets the RAM diagnostic flag equal to the second fault value (e.g., EDDE hexadecimal). After step 918, the method advances to step 920.

At step 920, the RAM diagnostic safety application 532 sends the RAM diagnostic flag to the second diagnostic handler application 522. After step 920, the method advances to step 922.

At step 922, the microprocessor 392 makes a determination as to whether the RAM diagnostic flag is not equal to the second fault value and the RAM diagnostic flag is not equal to the second non-fault value, or the RAM diagnostic flag is equal to the second fault value. If the value of step 922 equals "yes", the method advances to step 928. Otherwise, the method advances to step 930.

At step 928, the second diagnostic handler application 522 commands the digital input-output device 394 to induce the contactor 70 to transition to the open operational state, and each of the high voltage switch 250 and the low voltage switch 254 in the DC-DC voltage converter 100 to transition to the open operational state. After step 928, the method advances step 930.

At step 930, the second diagnostic handler application 522 sends an eighth index value (e.g., 4812 hexadecimal) to the microprocessor diagnostic safety application 534. The eighth index value is associated with the microprocessor 392. After step 930, the method advances to step 932.

At step 932, the microprocessor 392 makes a determination as to whether the eighth index value is equal to the third valid index value in the third table 660. If the value of step 932 equals "yes", the method advances to step 934. Otherwise, the method advances to step 936.

At step 934, the microprocessor diagnostic safety application 534 accesses the microprocessor diagnostic flag in the third table 660 in the RAM 400 utilizing the eighth index value (e.g., 4812 hexadecimal) as an index. The microprocessor diagnostic flag has the third fault value (e.g., B77B hexadecimal) if any of the third plurality of diagnostic flags indicate a fault condition in the microprocessor 392. The microprocessor diagnostic flag has the third non-fault value (e.g., 7BB7 hexadecimal) if all of the third plurality of diagnostic flags indicate the non-fault condition in the microprocessor 392. The eighth index value, the third fault value, and the third non-fault value each have a Hamming distance of at least eight from one another. After step 934, the method advances to step 936.

Referring again to step 932, if the value of step 932 equals "no", the method advances to step 936. At step 936, the microprocessor diagnostic safety application 534 sets the microprocessor diagnostic flag equal to the third fault value (e.g., B77B hexadecimal). After step 936, the method advances to step 940.

At step 940, the microprocessor diagnostic safety application 534 sends the microprocessor diagnostic flag to the second diagnostic handler application 522. After step 940, the method advances to step 942.

At step 942, the microprocessor 392 makes a determination as to whether the microprocessor diagnostic flag is not equal to the third fault value and the microprocessor diagnostic flag is not equal to the third non-fault value, or the microprocessor diagnostic flag is equal to the third fault value. If the value of step 942 equals "yes", the method advances to step 944. Otherwise, the method advances to step 946.

At step 944, the second diagnostic handler application 522 commands the digital input-output device 394 to induce the contactor 70 to transition to the open operational state, and each of the high voltage switch 250 and the low voltage switch 254 in the DC-DC voltage converter 100 to transition to the open operational state. After step 944, the method advances to step 946.

At step 946, the second diagnostic handler application 522 sends a ninth index value (e.g., 7EDB hexadecimal) to the power supply diagnostic safety application 536. The ninth index value is associated with the power supply 402. After step 946, the method advances to step 950.

At step 950, the microprocessor 392 makes a determination as to whether the ninth index value is equal to the fourth valid index value in the fourth table 670. If the value of step 950 equals "yes", the method advances to step 952. Otherwise, the method advances to step 956.

At step 952, the power supply diagnostic safety application 536 accesses the power supply diagnostic flag in the fourth table 670 in the RAM 400 utilizing the ninth index value (e.g., 7EDB hexadecimal) as an index. The power supply diagnostic flag has the fourth fault value (e.g., 1441 hexadecimal) if any of the fourth plurality of diagnostic flags indicate a fault condition in the power supply 402. The power supply diagnostic flag has the fourth non-fault value (e.g., 4114 hexadecimal) if all of the fourth plurality of diagnostic flags indicate the non-fault condition in the power supply 402. The ninth index value, the fourth fault value, and the fourth non-fault value each have a Hamming distance of at least eight from one another. After step 952, the method advances to step 958.

Referring again to step 950, if the value of step 950 equals "no", the method advances to step 956. At step 956, the power supply diagnostic safety application 536 sets the power supply diagnostic flag equal to the fourth fault value (e.g., 1441 hexadecimal). After step 956, the method advances to step 958.

At step 958, the power supply diagnostic safety application 536 sends the power supply diagnostic flag to the second diagnostic handler application 522. After step 958, the method advances to step 960.

At step 960, the microprocessor 392 makes a determination as to whether the power supply diagnostic flag is not equal to the fourth fault value and the power supply diagnostic flag is not equal to the fourth non-fault value, or the power supply diagnostic flag is equal to the fourth fault value. If the value of step 960 equals "yes", the method advances to step 962. Otherwise, the method advances to step 964.

At step 962, the second diagnostic handler application 522 commands the digital input-output device 394 to induce the contactor 70 to transition to the open operational state, and each of the high voltage switch 250 and the low voltage switch 254 in the DC-DC voltage converter 100 to transition to the open operational state. After step 962, the method advances to step 964.

At step 964, the second diagnostic handler application 522 sends a tenth index value (e.g., B7ED hexadecimal) to the clock diagnostic safety application 538. The tenth index value is associated with the clock 404. After step 964, the method advances to step 966.

At step 966, the microprocessor 392 makes a determination as to whether the tenth index value is equal to the fifth valid index value in the fifth table 680. If the value of step 966 equals "yes", the method advances to step 970. Otherwise, the method advances to step 972.

At step 970, the clock diagnostic safety application 538 accesses the clock diagnostic flag in the fifth table 680 in the RAM 400 utilizing the tenth index value (e.g., B7ED hexadecimal) as an index. The clock diagnostic flag has the fifth fault value (e.g., 4114 hexadecimal) if any of the fifth plurality of diagnostic flags indicate a fault condition in the clock 404. The clock diagnostic flag has the fifth non-fault value (e.g., 1441 hexadecimal) if all of the fifth plurality of diagnostic flags indicate the non-fault condition in the clock 404. The tenth index value, the fifth fault value, and the fifth non-fault value each have a Hamming distance of at least eight from one another. After step 970, the method advances to step 974.

Referring again to step 966, if the value of step 966 equals "no", the method advances to step 972. At step 972, the clock diagnostic safety application 538 sets the clock diagnostic flag equal to the fifth fault value (e.g., 4114 hexadecimal). After step 972, the method advances to step 974.

At step 974, the clock diagnostic safety application 538 sends the clock diagnostic flag to the second diagnostic handler application 522. After step 974, the method advances to step 976.

At step 976, the microprocessor 392 makes a determination as to whether the clock diagnostic flag is not equal to the fifth fault value and the clock diagnostic flag is not equal to the fifth non-fault value, or the clock diagnostic flag is equal to the fifth fault value. If the value of step 976 equals "yes", the method advances to step 978. Otherwise, the method is exited.

At step 978, the second diagnostic handler application 522 commands the digital input-output device 394 to induce the contactor 70 to transition to the open operational state, and each of the high voltage switch 250 and the low voltage switch 254 in the DC-DC voltage converter 100 to transition to the open operational state. After step 978, the method is exited.

The diagnostic system described herein provides a substantial advantage over other systems. In particular, the diagnostic system described herein utilizes a diagnostic handler application that sends an index value to a microcontroller core component diagnostic safety application, and in response the microcontroller core component diagnostic safety application accesses a diagnostic flag in RAM and sends the diagnostic flag to the diagnostic handler application. As a result, the diagnostic handler application cannot directly access the diagnostic flag in RAM which prevents the diagnostic handler application from inadvertently overwriting the diagnostic flag in the RAM.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a vehicle electrical system, comprising:
   a microcontroller having microcontroller core components, a first diagnostic handler application, and a microcontroller core component diagnostic safety application;
   the first diagnostic handler application sending a first index value to the microcontroller core component diagnostic safety application; the first index value being associated with a first microcontroller core component of the microcontroller core components;
   the microcontroller core component diagnostic safety application accessing a microcontroller core component diagnostic flag in a first table in a RAM if the first index value is equal to a valid index value in the first table, the microcontroller core component diagnostic flag having a first fault value if any of a plurality of diagnostic flags indicate a fault condition in the first microcontroller core component, the microcontroller core component diagnostic flag having a first non-fault value if all of the plurality of diagnostic flags indicate a non-fault condition in the first microcontroller core component; the first index value, the first fault value, and the first non-fault value each having a Hamming distance of at least eight from one another; and
   the microcontroller core component diagnostic safety application sending the microcontroller core component diagnostic flag to the first diagnostic handler application.

2. The diagnostic system of claim 1, wherein the first index value prevents the first diagnostic handler application from directly accessing a memory location in the RAM having the microcontroller core component diagnostic flag which prevents inadvertent overwriting of the microcontroller core component diagnostic flag.

3. The diagnostic system of claim 1, wherein:
   the microcontroller further having a second diagnostic handler application;
   the second diagnostic handler application sending a second index value to the microcontroller core component diagnostic safety application; the second index value being associated with the first microcontroller core component of the microcontroller core components; the second index value, the first fault value, and the first non-fault value each having a Hamming distance of at least eight from one another;
   the microcontroller core component diagnostic safety application accessing the microcontroller core component diagnostic flag in the first table in the RAM if the second index value is equal to the valid index value in the first table; and
   the microcontroller core component diagnostic safety application sending the microcontroller core component diagnostic flag to the second diagnostic handler application.

4. The diagnostic system of claim 3, wherein the second index value prevents the second diagnostic handler application from directly accessing the memory location in the RAM having the microcontroller core component diagnostic flag which prevents inadvertent overwriting of the microcontroller core component diagnostic flag.

5. The diagnostic system of claim 3, wherein the microcontroller further includes a digital input-output device, and the vehicle electrical system includes a first battery, a contactor, a DC-DC voltage converter, and a second battery; the contactor being electrically coupled between the first battery and the DC-DC voltage converter; the DC-DC voltage converter being electrically coupled between the contactor and the second battery;
   the first diagnostic handler application commanding the digital input-output device to induce the contactor to transition to an open operational state if the microcontroller core component diagnostic flag is equal to the first fault value; and
   the second diagnostic handler application commanding the digital input-output device to induce the contactor to transition to the open operational state if the microcontroller core component diagnostic flag is equal to the first fault value.

6. The diagnostic system of claim 5, wherein:
   the first diagnostic handler application commanding the digital input-output device to induce each of a high voltage switch and a low voltage switch in the DC-DC voltage converter to transition to the open operational state if the microcontroller core component diagnostic flag is equal to the first fault value; and
   the second diagnostic handler application commanding the digital input-output device to induce each of the high voltage switch and the low voltage switch in the DC-DC voltage converter to transition to the open operational state if the microcontroller core component diagnostic flag is equal to the first fault value.

7. The diagnostic system of claim 1, wherein the microcontroller core components include a microprocessor, a flash memory, a RAM, an internal power supply, and a clock.

8. The diagnostic system of claim 1, wherein:
   the first microcontroller core component being a flash memory;
   the microcontroller core component diagnostic safety application being a flash memory diagnostic safety application associated with the flash memory; and
   the microcontroller core component diagnostic flag being a flash memory diagnostic flag associated with the flash memory.

9. The diagnostic system of claim 1, wherein:
the first microcontroller core component being a microprocessor;
the microcontroller core component diagnostic safety application being a microprocessor diagnostic safety application associated with the microprocessor; and
the microcontroller core component diagnostic flag being a microprocessor diagnostic flag associated with the microprocessor.

10. The diagnostic system of claim 1, wherein:
the first microcontroller core component being a power supply;
the microcontroller core component diagnostic safety application being a power supply diagnostic safety application associated with the power supply; and
the microcontroller core component diagnostic flag being a power supply diagnostic flag associated with the power supply.

11. The diagnostic system of claim 1, wherein:
the first microcontroller core component being a clock;
the microcontroller core component diagnostic safety application being a clock diagnostic safety application associated with the clock; and
the microcontroller core component diagnostic flag being a clock supply diagnostic flag associated with the clock.

12. The diagnostic system of claim 1, wherein:
the first microcontroller core component being the RAM;
the microcontroller core component diagnostic safety application being a RAM diagnostic safety application associated with the RAM; and
the microcontroller core component diagnostic flag being a RAM diagnostic flag associated with the RAM.

* * * * *